(12) United States Patent
Peterson et al.

(10) Patent No.: US 8,912,458 B2
(45) Date of Patent: *Dec. 16, 2014

(54) TOUCHSURFACE WITH LEVEL AND PLANAR TRANSLATIONAL TRAVEL RESPONSIVENESS

(75) Inventors: Cody G. Peterson, Coeur d'Alene, ID (US); Douglas M. Krumpelman, Hayden, ID (US); Michael D. Levin, Los Altos, CA (US)

(73) Assignee: Synaptics Incorporated, San Jose, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 13/568,060

(22) Filed: Aug. 6, 2012

(65) Prior Publication Data

US 2012/0299832 A1 Nov. 29, 2012

Related U.S. Application Data

(63) Continuation-in-part of application No. 13/198,610, filed on Aug. 4, 2011, and a continuation-in-part of (Continued)

(51) Int. Cl.
*H01H 13/70* (2006.01)
*G06F 3/02* (2006.01)

(Continued)

(52) U.S. Cl.
CPC ........ *G06F 3/0202* (2013.01); *H01H 2215/042* (2013.01); *H01H 2221/058* (2013.01); *H01H 2215/002* (2013.01); *H01H 2221/04* (2013.01); *H01H 3/122* (2013.01); *H01H 13/85* (2013.01); *H01H 2013/525* (2013.01); *H01H 2221/014* (2013.01); *H01H 2227/036* (2013.01)
USPC ....................................................... 200/344

(58) Field of Classification Search
USPC ........................... 200/600; 345/168, 173.174
IPC . H03K 17/96,17/962, 17/975; H01H 2239/006, H01H 2227/034; G06F 3/02, 3/0219, 3/213, G06F 3/044
See application file for complete search history.

(56) References Cited

U.S. PATENT DOCUMENTS 3,886,341 A 5/1975 Forrest
3,938,642 A 2/1976 Van Rumpt et al.
(Continued)

FOREIGN PATENT DOCUMENTS

AU 727962 B2 1/2001
CN 1142117 A 2/1997
(Continued)

OTHER PUBLICATIONS

"Final Office Action mailed Aug. 1, 2012", U.S. Appl. No. 12/580,002, 23 pages.
(Continued)

*Primary Examiner* — Vanessa Girardi
(74) *Attorney, Agent, or Firm* — Ingrassia Fisher & Lorenz P.C.

(57) ABSTRACT

Described herein are one or more techniques related to a touchsurface with level and planar translational travel responsiveness. One or more of the described implementations include an input device having a rigid body including a touchsurface configured to travel along a depression path in response to being depressed by a user. The input device also includes a leveling mechanism that operates in manner to keep the touchsurface substantially level as the touchsurface travels along the depression path in response to being depressed by the user. Furthermore, the input device has a planar-translation-effecting mechanism that defines a planar translation component of the depression path, such that the touchsurface exhibits planar translation as the touchsurface travels along the depression path.

20 Claims, 21 Drawing Sheets

Related U.S. Application Data application No. 13/323,292, filed on Dec. 12, 2011, now Pat. No. 8,309,870, which is a continuation-in-part of application No. 13/198,610.

(60) Provisional application No. 61/471,186, filed on Apr. 3, 2011, provisional application No. 61/429,749, filed on Jan. 4, 2011.

(51) Int. Cl.
*H01H 13/85* (2006.01)
*H01H 3/12* (2006.01)
*H01H 13/52* (2006.01)

(56) References Cited

U.S. PATENT DOCUMENTS

| | | | |
|---|---|---|---|
| 4,039,068 A | 8/1977 | Giorza et al. | |
| 4,056,701 A | 11/1977 | Weber | |
| 4,265,557 A | 5/1981 | Runge | |
| 4,294,555 A | 10/1981 | Galaske et al. | |
| 4,326,195 A | 4/1982 | Seki et al. | |
| 4,334,280 A | 6/1982 | McDonald | |
| 4,403,123 A | 9/1983 | Shek | |
| 4,480,162 A | 10/1984 | Greenwood | |
| D278,239 S | 4/1985 | Felix et al. | |
| D284,574 S | 7/1986 | Fischer | |
| D292,801 S | 11/1987 | Davis et al. | |
| 4,735,520 A | 4/1988 | Suzuki et al. | |
| 4,786,766 A | 11/1988 | Kobayashi | |
| 4,885,565 A | 12/1989 | Embach | |
| D312,623 S | 12/1990 | Carter et al. | |
| 5,053,591 A | 10/1991 | Theurer | |
| 5,121,091 A | 6/1992 | Fujiyama | |
| 5,189,390 A | 2/1993 | Fagard | |
| 5,212,473 A | 5/1993 | Louis | |
| 5,239,152 A | 8/1993 | Caldwell et al. | |
| 5,329,278 A | 7/1994 | Dombroski | |
| 5,418,530 A | 5/1995 | Moore et al. | |
| 5,463,195 A | 10/1995 | Watanabe et al. | |
| 5,523,730 A | 6/1996 | Van Zeeland | |
| 5,575,576 A | 11/1996 | Roysden, Jr. | |
| 5,626,223 A | 5/1997 | Lee | |
| 5,666,096 A | 9/1997 | Van Zeeland | |
| 5,667,061 A | 9/1997 | Lee | |
| 5,763,842 A | 6/1998 | Tsai et al. | |
| 5,767,463 A | 6/1998 | Gandre | |
| 5,828,015 A | 10/1998 | Coulon | |
| 5,867,082 A | 2/1999 | Van Zeeland | |
| 5,902,972 A | 5/1999 | Nestor et al. | |
| 5,921,382 A | 7/1999 | Retter | |
| 5,934,454 A | 8/1999 | Burleson et al. | |
| 5,973,670 A | 10/1999 | Barber et al. | |
| 5,977,867 A | 11/1999 | Blouin | |
| 5,977,888 A | 11/1999 | Fujita et al. | |
| 5,982,304 A | 11/1999 | Selker et al. | |
| 5,990,772 A | 11/1999 | Van Zeeland et al. | |
| 6,039,258 A | 3/2000 | Durbin et al. | |
| 6,046,730 A | 4/2000 | Bowen et al. | |
| 6,067,081 A | 5/2000 | Hahlganss et al. | |
| 6,069,545 A | 5/2000 | Van Zeeland | |
| 6,069,552 A | 5/2000 | Van Zeeland | |
| 6,118,435 A | 9/2000 | Fujita et al. | |
| 6,130,593 A | 10/2000 | Van Zeeland | |
| 6,166,662 A | 12/2000 | Chuang | |
| 6,218,966 B1 | 4/2001 | Goodwin et al. | |
| 6,219,034 B1 | 4/2001 | Elbing et al. | |
| 6,262,646 B1 | 7/2001 | Van Zeeland | |
| 6,262,717 B1 | 7/2001 | Donohue et al. | |
| 6,305,071 B1 | 10/2001 | Van Zeeland | |
| 6,328,489 B1 | 12/2001 | Chi-Pin | |
| 6,369,692 B1 | 4/2002 | Van Zeeland | |
| 6,369,803 B2 | 4/2002 | Brisebois et al. | |
| 6,373,463 B1 | 4/2002 | Beeks | |
| 6,375,372 B1 | 4/2002 | Tsau | |
| 6,392,515 B1 | 5/2002 | Van Zeeland et al. | |
| 6,400,246 B1 | 6/2002 | Hill et al. | |
| 6,429,846 B2 | 8/2002 | Rosenberg et al. | |
| 6,430,023 B1 | 8/2002 | Suzuki | |
| 6,455,794 B2 | 9/2002 | Sato et al. | |
| 6,466,118 B1 | 10/2002 | Van Zeeland et al. | |
| 6,509,818 B1 | 1/2003 | Van Zeeland | |
| 6,542,058 B2 | 4/2003 | Van Zeeland | |
| 6,556,112 B1 | 4/2003 | Van Zeeland et al. | |
| 6,563,434 B1 | 5/2003 | Olodort et al. | |
| 6,566,616 B1 | 5/2003 | Ha | |
| 6,657,139 B2 | 12/2003 | Hasunuma | |
| 6,677,843 B1 | 1/2004 | Monroe et al. | |
| 6,693,626 B1 | 2/2004 | Rosenberg | |
| 6,723,935 B1 | 4/2004 | Watanabe | |
| 6,723,937 B2 | 4/2004 | Englemann et al. | |
| 6,750,415 B2 | 6/2004 | Yamagami | |
| 6,761,494 B2 | 7/2004 | Hsu et al. | |
| 6,819,990 B2 | 11/2004 | Ichinose | |
| 6,822,635 B2 | 11/2004 | Shahoian et al. | |
| 6,861,603 B1 | 3/2005 | Wang | |
| 6,880,994 B2 | 4/2005 | Takahashi | |
| 6,911,901 B2 | 6/2005 | Bown | |
| 6,937,124 B1 | 8/2005 | Nakamura et al. | |
| 6,939,065 B2 | 9/2005 | Roysden, Jr. | |
| 6,940,030 B2 | 9/2005 | Takeda et al. | |
| 6,982,617 B2 | 1/2006 | Brilon et al. | |
| D527,004 S | 8/2006 | Yen | |
| 7,106,305 B2 | 9/2006 | Rosenberg | |
| 7,113,177 B2 | 9/2006 | Franzen | |
| 7,119,798 B2 | 10/2006 | Yoshikawa et al. | |
| 7,148,789 B2 | 12/2006 | Sadler et al. | |
| 7,166,795 B2 | 1/2007 | Lengeling | |
| 7,182,691 B1 | 2/2007 | Schena | |
| 7,196,688 B2 | 3/2007 | Schena | |
| 7,215,329 B2 | 5/2007 | Yoshikawa et al. | |
| 7,224,106 B2 | 5/2007 | Pei et al. | |
| 7,227,537 B2 | 6/2007 | Nakayama et al. | |
| 7,269,484 B2 | 9/2007 | Hein | |
| 7,292,227 B2 | 11/2007 | Fukumoto et al. | |
| 7,312,791 B2 | 12/2007 | Hoshino et al. | |
| 7,324,094 B2 | 1/2008 | Moilanen et al. | |
| 7,336,266 B2 | 2/2008 | Hayward et al. | |
| 7,339,572 B2 | 3/2008 | Schena | |
| 7,342,573 B2 | 3/2008 | Ryynaenen | |
| 7,375,656 B2 | 5/2008 | Mueller et al. | |
| 7,385,308 B2 | 6/2008 | Yerdon et al. | |
| 7,400,319 B2 | 7/2008 | Nakayama et al. | |
| 7,450,110 B2 | 11/2008 | Shahoian et al. | |
| 7,525,415 B2 | 4/2009 | Yatsu et al. | |
| 7,548,232 B2 | 6/2009 | Shahoian et al. | |
| 7,567,232 B2 | 7/2009 | Rosenberg | |
| 7,569,786 B2 | 8/2009 | Spies | |
| 7,573,460 B2 | 8/2009 | Strawn et al. | |
| 7,579,758 B2 | 8/2009 | Maruyama et al. | |
| 7,589,607 B2 | 9/2009 | Rochon et al. | |
| 7,592,901 B2 | 9/2009 | Furusho | |
| 7,592,999 B2 | 9/2009 | Rosenberg et al. | |
| 7,602,384 B2 | 10/2009 | Rosenberg et al. | |
| 7,607,087 B2 | 10/2009 | Prados | |
| 7,701,440 B2 | 4/2010 | Harley | |
| 7,855,715 B1 | 12/2010 | Bowen | |
| 7,868,515 B2 | 1/2011 | Krochmal et al. | |
| 7,898,440 B2 | 3/2011 | Chen | |
| 7,906,875 B2 * | 3/2011 | Caldwell et al. | 307/139 |
| 7,969,288 B2 | 6/2011 | Braun et al. | |
| 7,982,720 B2 | 7/2011 | Rosenberg et al. | |
| 8,031,181 B2 | 10/2011 | Rosenberg et al. | |
| 8,059,105 B2 | 11/2011 | Rosenberg et al. | |
| 8,217,289 B2 | 7/2012 | Liu | |
| 8,232,969 B2 | 7/2012 | Grant et al. | |
| 8,245,158 B1 | 8/2012 | Schrick | |
| 8,248,278 B2 | 8/2012 | Schlosser et al. | |
| 2001/0002648 A1 | 6/2001 | Van Zeeland | |
| 2002/0054060 A1 | 5/2002 | Schena | |
| 2002/0084721 A1 | 7/2002 | Walczak | |
| 2002/0149561 A1 | 10/2002 | Fukumoto et al. | |
| 2003/0067449 A1 | 4/2003 | Yoshikawa et al. | |
| 2003/0209131 A1 | 11/2003 | Asahi | |

(56) References Cited

U.S. PATENT DOCUMENTS

| | | |
|---|---|---|
| 2003/0210233 A1 | 11/2003 | Frulla |
| 2004/0252104 A1 | 12/2004 | Nakamura et al. |
| 2005/0017947 A1 | 1/2005 | Shahoian et al. |
| 2005/0157893 A1 | 7/2005 | Pelrine et al. |
| 2005/0204906 A1 | 9/2005 | Lengeling |
| 2005/0237309 A1 | 10/2005 | Sharma |
| 2006/0109256 A1 | 5/2006 | Grant et al. |
| 2006/0113880 A1 | 6/2006 | Pei et al. |
| 2006/0256075 A1 | 11/2006 | Anastas et al. |
| 2006/0261983 A1 | 11/2006 | Griffin et al. |
| 2007/0031097 A1 | 2/2007 | Heikenfeld et al. |
| 2007/0080951 A1 | 4/2007 | Maruyama et al. |
| 2007/0091070 A1 | 4/2007 | Larsen et al. |
| 2007/0146317 A1 | 6/2007 | Schena |
| 2007/0146334 A1 | 6/2007 | Inokawa |
| 2007/0152974 A1 | 7/2007 | Kim et al. |
| 2007/0193436 A1 | 8/2007 | Chu |
| 2007/0205988 A1 | 9/2007 | Gloyd et al. |
| 2007/0234887 A1 | 10/2007 | Sawada et al. |
| 2007/0234890 A1 | 10/2007 | Yamashita |
| 2007/0236449 A1 | 10/2007 | Lacroix et al. |
| 2007/0236450 A1 | 10/2007 | Colgate et al. |
| 2008/0007529 A1 | 1/2008 | Paun et al. |
| 2008/0083314 A1 | 4/2008 | Hayashi et al. |
| 2008/0084384 A1 | 4/2008 | Gregorio et al. |
| 2008/0087476 A1 | 4/2008 | Prest et al. |
| 2008/0092720 A1 | 4/2008 | Yamashita et al. |
| 2008/0100568 A1 | 5/2008 | Koch et al. |
| 2008/0165127 A1 | 7/2008 | Eom |
| 2008/0264770 A1 | 10/2008 | Purcocks |
| 2008/0289952 A1 | 11/2008 | Pelrine et al. |
| 2008/0302647 A1 | 12/2008 | Villain et al. |
| 2008/0303782 A1 | 12/2008 | Grant et al. |
| 2009/0002205 A1 | 1/2009 | Klinghult et al. |
| 2009/0046069 A1 | 2/2009 | Griffin et al. |
| 2009/0072662 A1 | 3/2009 | Sadler et al. |
| 2009/0073128 A1 | 3/2009 | Marsden |
| 2009/0079593 A1 | 3/2009 | Yamakawa et al. |
| 2009/0088220 A1 | 4/2009 | Persson |
| 2009/0128501 A1 | 5/2009 | Lazaridis et al. |
| 2009/0178913 A1 | 7/2009 | Peterson et al. |
| 2009/0189790 A1 | 7/2009 | Peterson et al. |
| 2009/0189873 A1 | 7/2009 | Peterson et al. |
| 2009/0210568 A1 | 8/2009 | Peterson et al. |
| 2009/0231277 A1 | 9/2009 | Peterson et al. |
| 2009/0255793 A1 | 10/2009 | Krochmal et al. |
| 2010/0109486 A1 | 5/2010 | Polyakov et al. |
| 2010/0171715 A1 | 7/2010 | Peterson et al. |
| 2010/0231423 A1 | 9/2010 | Yang |
| 2010/0245231 A1 | 9/2010 | Aramaki |
| 2011/0096013 A1 | 4/2011 | Krumpelman et al. |
| 2011/0128239 A1 | 6/2011 | Polyakov et al. |
| 2011/0203912 A1 | 8/2011 | Niu |
| 2011/0227763 A1 | 9/2011 | Schlosser et al. |
| 2011/0227872 A1 | 9/2011 | Huska et al. |
| 2011/0234494 A1 | 9/2011 | Huska et al. |
| 2012/0043191 A1 | 2/2012 | Kessler et al. |
| 2012/0092263 A1 | 4/2012 | Peterson et al. |
| 2012/0169603 A1 | 7/2012 | Peterson et al. |
| 2012/0299832 A1 | 11/2012 | Peterson et al. |

FOREIGN PATENT DOCUMENTS

| | | | |
|---|---|---|---|
| DE | 19704253 A | 8/1998 | |
| DE | 10126670 A1 | 12/2002 | |
| DE | 2005002417 A | 4/2005 | |
| DE | 202005002417 A | 4/2005 | |
| DE | 2004005501 A | 8/2005 | |
| DE | 102004005501 A | 8/2005 | |
| EP | 0278916 A | 8/1988 | |
| EP | 1310860 A | 5/2003 | |
| EP | 1548776 A | 6/2005 | |
| EP | 2003666 A1 | 12/2008 | |
| EP | 2287873 A | 2/2011 | |
| JP | 2000348562 A | 12/2000 | |
| JP | 2007173087 A | 7/2007 | |
| JP | 2011233406 A | 11/2011 | |
| WO | 0191100 A | 11/2001 | |
| WO | 02073587 A | 9/2002 | |
| WO | 2009043605 A | 4/2009 | |
| WO | 2009067708 A1 | 5/2009 | |
| WO | 2009097358 A | 8/2009 | |
| WO | 2009097359 A | 8/2009 | |
| WO | 2009097361 A2 | 8/2009 | |
| WO | 2009114827 A | 9/2009 | |

OTHER PUBLICATIONS

Raisamo, Roope "Tactile User Interfaces", New Interaction Techniques,(Aug. 2, 2001),30 pages.

Seeger, Joseph et al., "Dynamics and Control of Parallel-Plate Actuators Beyond the Electrostatic Instability", Transducers 99 The 10th International Conference on Solid State Sensors and Actuators, (Jun. 1999),pp. 474-477.

Sommer-Larsen, Peter "Artificial Muscles", Rise National Laboratory, Condensed Matter Physics and Chemistry Department,3 pages.

Spires, Shelby "Artificial Strongman", Smart Business: For the New Economy, (Nov. 2000),1 page.

Srinivasan, Mandayam A., et al, "Role of Skin Biomechanics in Mechanoreceptor Response", Retrieved from <http://touchlab.mit.edu/oldresearch/currentworldhumanhaptics/roleofsk- inbiomechanics/> on Dec. 20, 2007, MIT Touch Lab, (Dec. 20, 2007),pp. 1-13.

Supplemental Notice of Allowance mailed May 20, 2010, U.S. Appl. No. 11/945,879, 5 pages.

Wagner, Christopher et al., "Integrating Tactile and Force Feedback with Finite Element Models", Division of Engineering and Applied Sciences, Harvard University,6 pages.

Wagstaff, Jeremy, "A Passion for the Keys", The Wall Street Journal Online, Nov. 23, 2007, 3 pages, retrieved from the Internet at online.wsj.com/article_print/SB119578337324301744.html.

Wing, Alan et al., "Multidimensional Haptics Preliminary Report", Retrieved from <http://www.touch-hapsys.org>, (Sep. 21, 2003),pp. 1-125.

Wingert, Andreas et al., "On the Kinematics of Parallel Mechanisms with Bio-stable Polymer Actuators", Department of Mechanical Engineering, Massachusetts Institute of Technology Cambridge,8 pages.

Non-Final Office Action mailed May 14, 2012, U.S. Appl. No. 13/323,292, 19 pages.

Final Office Action mailed Aug. 1, 2012 for U.S. Appl. No. 12/580,002, 23 pages.

United States Patent and Trademark Office, US Non-final Office Action for U.S. Appl. No. 12/975,733 dated Oct. 25, 2013.

Poupyrev, Ivan, et al., "TouchEngine: A Tactile Display for Handheld Devices", 2002, 2 pages.

Srinivasan, Mandayam A., et al, "Role of Skin Biomechanics in Mechanoreceptor Response", Retrieved from <http://touchlab.mit.edu/oldresearch/currentwork/humanhaptics/roleofsk- inbiomechanics/> on Dec. 20, 2007, MIT Touch Lab, (Dec. 20, 2007),pp. 1-13.

Wu, Xingtao et al., "A Generalized Capacitance-Based Model for Electrostatic Micro-Actuators", Department of Physics, New Jersey Institute of Technology, Newark, NJ, 07102-1982 Department of Mechanical Engineering, Columbia University, NY 10027, pp. 1-23.

Yang, Gi-Hun, "Novel Haptic Mouse System for Holistic Haptic Display and Potential of Vibrotactile Stimulation", Human-Robot Interaction Research Center, Korea Advanced Institute of Science and Technology, 2005, 17 pages.

Zou, Jun et al., "Design of a Wide Turning Range Micromachined Turnable Capacitor for Wireless Communications", First IEEE Electro/Information Technology Conference, Jun. 8-11, Chicago, IL, 2000, 6 pages.

"Elastomers: Powerful Polymer", Retrieved from <http://appliancedesign.com/copyright/>, (Jun. 2006),5 pages.

"Haptic Touch Technology", Pacinian,(Nov. 2007),2 pages.

"Haptics: Learning Through Touch", Retrieved from <http://ced.ncsu.edu/nanoscale/haptics.htm>, (2004),5 pages.

"International Search Report and Written Opinion", Application No. PCT/US2010/020380, (Apr. 12, 2010),10 pages.

(56) References Cited

OTHER PUBLICATIONS

"Nanoactuators Based on Electrostatic Forces on Dielectrics", Retrieved from <http://www.nasatech.com/Briefs/Apr05/NP030747.html>on Nov. 28, 2005, NASA's Jet Propulsion Laboratory, Pasadena, CA,4 pages.
New SRI International sSpin-Off, Artificial Muscle, Inc., Secure Series a Funding from Leading VC Firms, Retrieved from <http://www.sri.com/news/releases/05-03-04.html> on Jan. 30, 2008, SRI International Spin Offs Artificial Muscle, Inc,(May 2004),2 pages.
"Non-Final Office Action mailed Dec. 9, 2011", U.S. Appl. No. 12/580,002, 21 pages.
"Proposed Experiment Protocol and Details", Retrieved from <http://bdml.stanford.edu/twiki/bin/view/Haptics/ProposedExperiOmentPr- otocolAndDetails>, 5 pages.
"Tactile Perception and Design", Retrieved from http://www.tireesias.org/reports.tpd2.htm on Apr. 4, 2006, 10 pages.
"Touch and Haptics", 2004 IEEE/ RSJ International Conference on Intelligent Robots and Systems, (Sep. 28, 2004),32 pages.
"Touch-Hapsys", Retrieved from <http://www.touch-hapsys.org>, 2 pages.
Ashley, Steven "Artificial Muscles", Scientific American, Available at <www.sciam.com>,(Oct. 2003),pp. 53-59.
Bar-Cohen, Y. "Electroactive Polymer (EAP) Actuators as Artificial Muscles—Reality, Potential and Challenges", SPIE Press, (Mar. 18, 2004),pp. 26 and 548-550.
Bar-Cohen, Yoseph "Electric Flex", IEEE Spectrum Online, (Jun. 2004),6 pages.
Bar-Cohen, Yoseph "Electroactive Polymers as Artificial Muscles—Capabilities, Potentials and Challenges", Robotics 2000, Available at <www.spaceandrobotics>,(Feb. 28-Mar. 2, 2000),pp. 1-8.
Bar-Cohen, Yoseph "Electroactive Polymers", Retrieved from <http://electrochem.cwru.edu/ed/encycl/>, Electrochemistry Encyclopedia,(Dec. 2004),7 pages.
Bar-Cohen, Yoseph "Low Mass Muscle Actuators (LoMMAs)", Telerobotic Task Sponsored by NASA HQ, Code S, (Oct. 23, 1997),18 pages.
Bar-Cohen, Yoseph "Worldwide Electroactive Polymers", (Artificial Muscles) Newsletter, vol. 7, No. 2, Available at <http://eap.jpl.nasa.gov>,(Dec. 2005),pp. 1-16.
Bar-Cohen, Yoseph et al., "Enabling Novel Planetary and Terrestrial Mechanisms Using Electroactive Materials at the JPL's NDEAA Lab", Retrieved from http://ndeaa.jp1.nasa.gov>, pp. 1-6.
Bark, Karlin "Functional Prototype I", Retrieved from <http://bdml.stanford.edu/twiki/bin/view/Haptics/FunctionalPrototypeI?-skin=print.pattern>, (Aug. 9, 2005),3 pages.
Beavers, Alex "Basic Concepts for Commercial Applications of Electroactive Polymer Artificial Muscle", Artificial Muscle Incorporated, Menlo Park, CA,10 pages.
Bicchi, Antonio et al., "Haptic Illusions Induced by the Tactile Flow", Interdepartmental Research Centre "E. Piaggo", University of Pisa,12 pages.
Bifano, Thomas, "Parallel Plate Electrostatic Actuation for High-Resolution Deformable Mirrors", Boston University, Boston, MA, Aug. 19, 2004.
Biggs, James "Some Useful Information for Tactile Display Design", IEEE Transactions on Man-Machine Systems, vol. 11, No. 1,(1970),pp. 19-24.
Carpi, Federico et al., "Dielectric Elastomers as Electromechanical Transducers: Fundamentals, Materials, Devices, Models and Applications of an Emerging Elecrotactive Polymer Technology", Elsevier Ltd., (2008),12 pages.
Fontaine, Ebraheem "A Laboratory Demonstration of a Parallel Robotic Mechanism", Massachusetts Institute of Technology,(Jun. 2002),pp. 1-14.
Fukumoto, Masaki, et al, "Active Click: Tactile Feedback for Touch Panels", NTT DoCoMo Multimedia Labs, Mar. 31, 2001, 2 pages.
Gorinevsky, Dimitry "Adaptive membrane for large lightweight space telescopes", SPIE Astronomical Telescopes and Instrumentation,(2002),pp. 1-9.

Hayward, Vincent et al., "Tactile Display Device Using Distributed Lateral Skin Stretch", Proceedings of the Haptic Interfaces for Virtual Environment and Teleoperator Systems Symposium, ASME International Mechanical Engineering Congress & Exposition,(2000),pp. 1309-1314.
Hollis, Ralph "Haptics", Berkshire Encyclopedia of Human-Computer Interaction, Berkshire Publishing Group,(2004), pp. 311-316.
Jager, Edwin et al., "Microfabricating Conjugated Polymer Actuators", Science Magazine, vol. 290, www.sciencemag.org,(Nov. 24, 2000),pp. 1540-1544.
Jones, Gail et al., "A Comparison of Learning with Haptic and Visual Modalities", National Science Foundation REC-0087389,pp. 1-20.
Jones, Lynette "Human Factors and Haptic Interfaces", Department of Mechanical Engineering, Massachusetts Institute of Technology,40 pages.
Jungmann, M., et al, Miniaturised Electrostatic Tactile Display with High Structural Compliance, 2002, 6 pages.
Kajimoto, Hiroyuki et al., "Electro-Tactile Display with Tactile Primary Color Approach", Graduate School of Information and Technology, The University of Tokyo,2 pages.
Mackenzie, Scott, et al, "The Tactile Touchpad", 1997, 5 pages.
Mackenzie, Scott, et al., "A Comparison of Three Selection Techniques for Touchpads", Proceedings of the CHI'98 Conference on Human Factors in Computing Systems, pp. 336-343 New York 1998.
Mok Ha, Soon et al., "Interpenetrating Polymer Networks for High-Performance Electroelastomer Artificial Muscles", Department of Materials Science and Engineering, UCLA,pp. 1-19.
Non-Final Office Action mailed Feb. 13, 2009, U.S. Appl. No. 11/945,879.
Odell, D.L. et al., "MicroRobot Conveyance and Propulsion System Using Comb Drive and Parallel Plate Actuators: The ScuttleBot", UC Berkley,4 pages.
O'Halloran, A et al., "Materials and Technologies for Artificial Muscle: A Review for the Mechatronic Muscle Project", Topics in Bio-Mechanical Engineering, Chapter 7, Department of Electronic Engineering, National University of Ireland Galway,(2004),pp. 184-215.
Oniszczak, Aleks, "VersaPad Driver Plus Pack", 1999, 3 pages.
Pasquero, Jerome "Stimulation of the Fingertip by Lateral Skin Strech", Retrieved from <http://www.cim.mcgill.ca/.about.jay/index.sub.-files/research.htm>- ;, 5 pages.
Pasquero, Jerome "Stress: A Tactile Display Using Lateral Skin Stretch", Department of Electrical and Computer Engineering McGill University, Montreal,(Oct. 2003),75 pages.
Pasquero, Jerome "Survey on Communication Through Touch", Technical Report: TR-CIM 06.04, Center for Intelligent Machines Department of Electrical and Computer Engineering,(Jul. 2006),pp. 1-27.
Pasquero, Jerome "Tactile Display Survey", Technical Report TR-CIM 06.04,6 pages.
Pei, Qibing et al., "Multiple-Degrees-of-Freedom Electroelastomer Roll Actuators", SRI International Institute of Physics Publishing, (2004),pp. N86-N92.
Poupyrev, Ivan, et al., "Tactile Interfaces for Small Touch Screens", 2003, 4 pages.
USPTO, Non-Final Office Action in U.S. Appl. No. 13/198,610, mailed Apr. 17, 2014.
"New SRI International sSpin-Off, Artificial Muscle, Inc., Secure Series a Funding from Leading VC Firms", Retrieved from <http://www.sri.com/news/releases/05-03-04.html> on Jan. 30, 2008, SRI International Spin Offs Artificial Muscle, Inc,(May 2004),2 pages.
"Non-Final Office Action mailed May 14, 2012", U.S. Appl. No. 13/323,292, 19 pages.
"Touch and Haptics", 2004 IEEE/RSJ International Conference on Intelligent Robots and Systems, (Sep. 28, 2004),32 pages.
Bar-Cohen, Yoseph "Electroactive Polymers as Artificial Muscles-Capabilities, Potentials and Challenges", Robotics 2000, Available at <www.spaceandrobotics>,(Feb. 28-Mar. 2, 2000),pp. 1-8.

(56) References Cited

OTHER PUBLICATIONS

Bar-Cohen, Yoseph et al., "Enabling Novel Planetary and Terrestrial Mechanisms Using Electroactive Materials at the JPL's NDEAA Lab", Retrieved from http://ndeaajpl.nasa.gov>, pp. 1-6.

Bifano, Thomas "Parallel Plate Electrostatic Actuation for High-Resolution Deformable Mirrors", Boston University, (Aug. 19, 2004),35 pages.

Fontaine, Ebraheem "A Laboratory Demonstration of a Parallel Robotic Mechanism", Massachusetts Institute of Technology,(Jun. 2002),pp. 1-14.

Pasquero, Jerome "Stimulation of the Fingertip by Lateral Skin Strech", Retrieved from <http://www.cim.mcgill.ca/.aboutlay/index.sub.--files/research.htm>- ;, 5 pages.

USPTO, Notice of Allowance and Fee(s) Due for U.S. Appl. No. 13/198,610, mailed Jul. 24, 2014.

* cited by examiner (background)

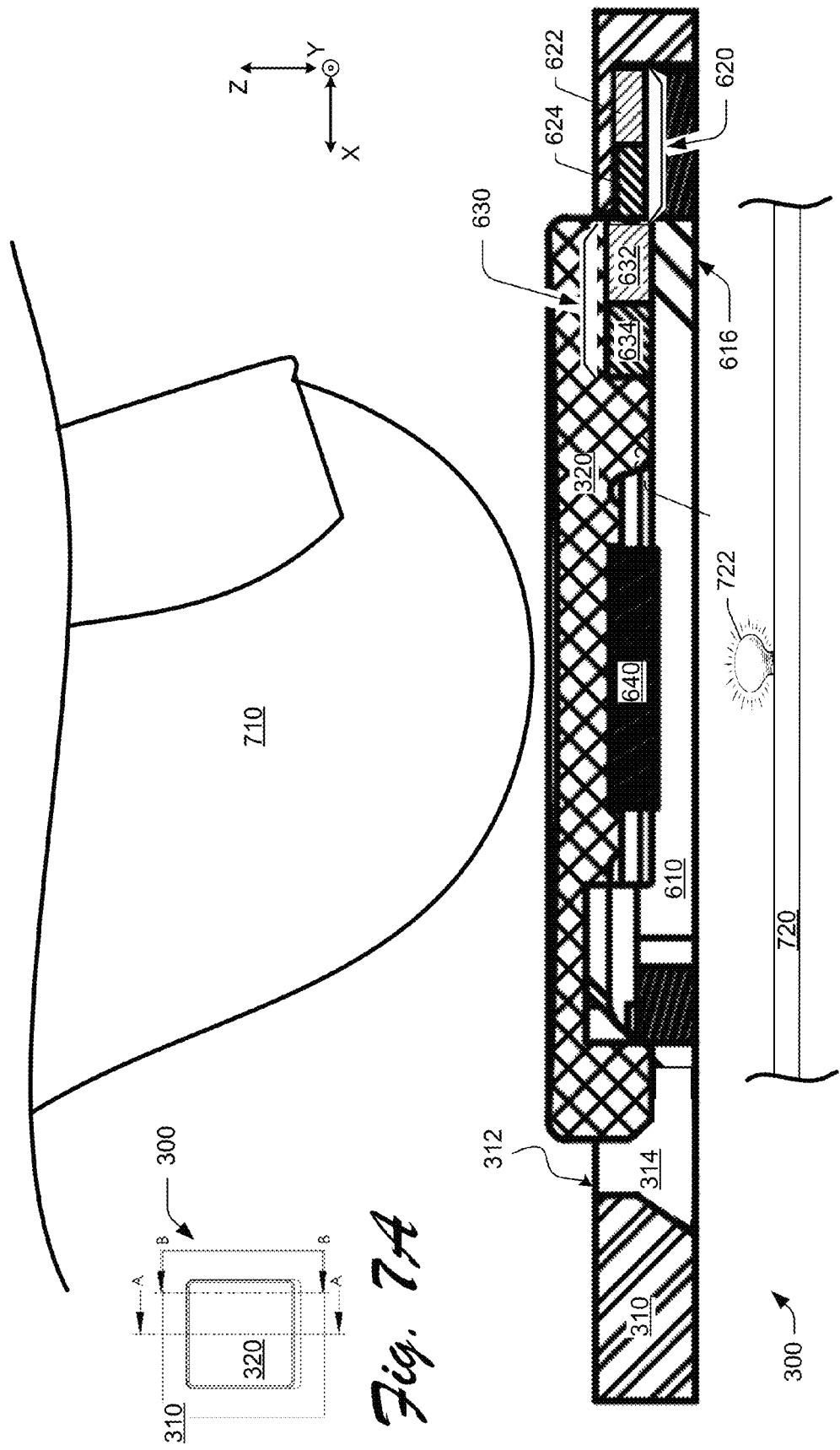

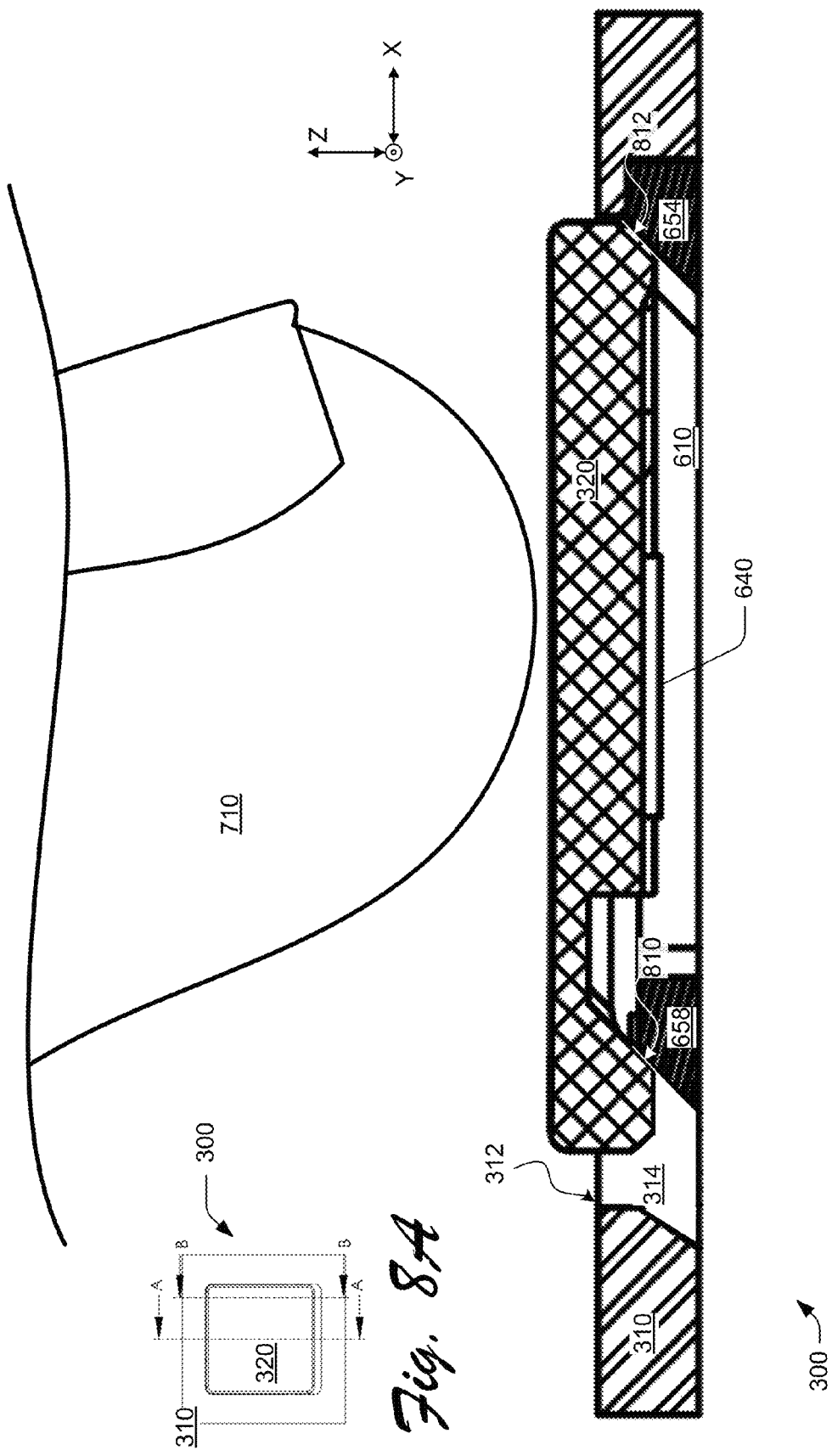

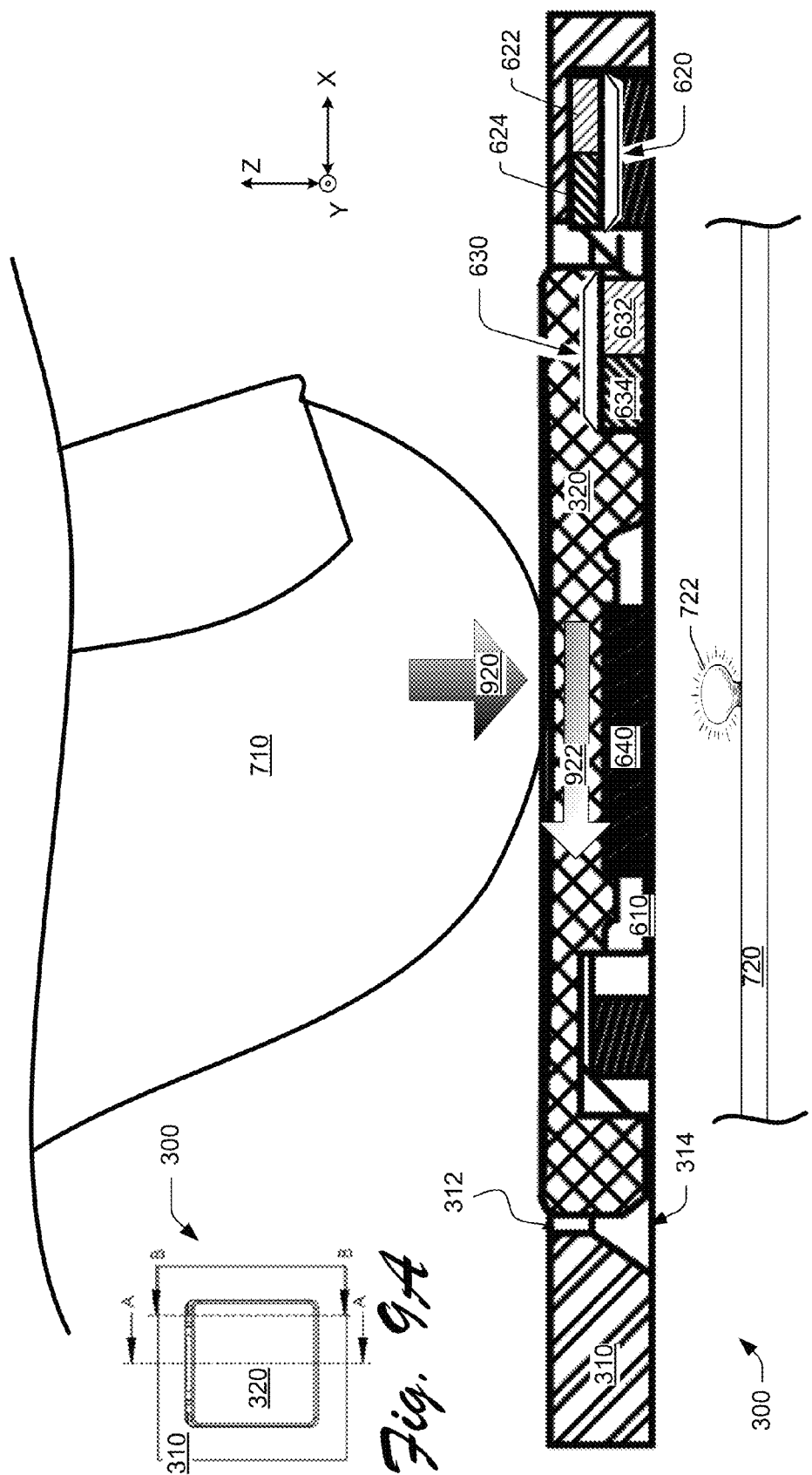

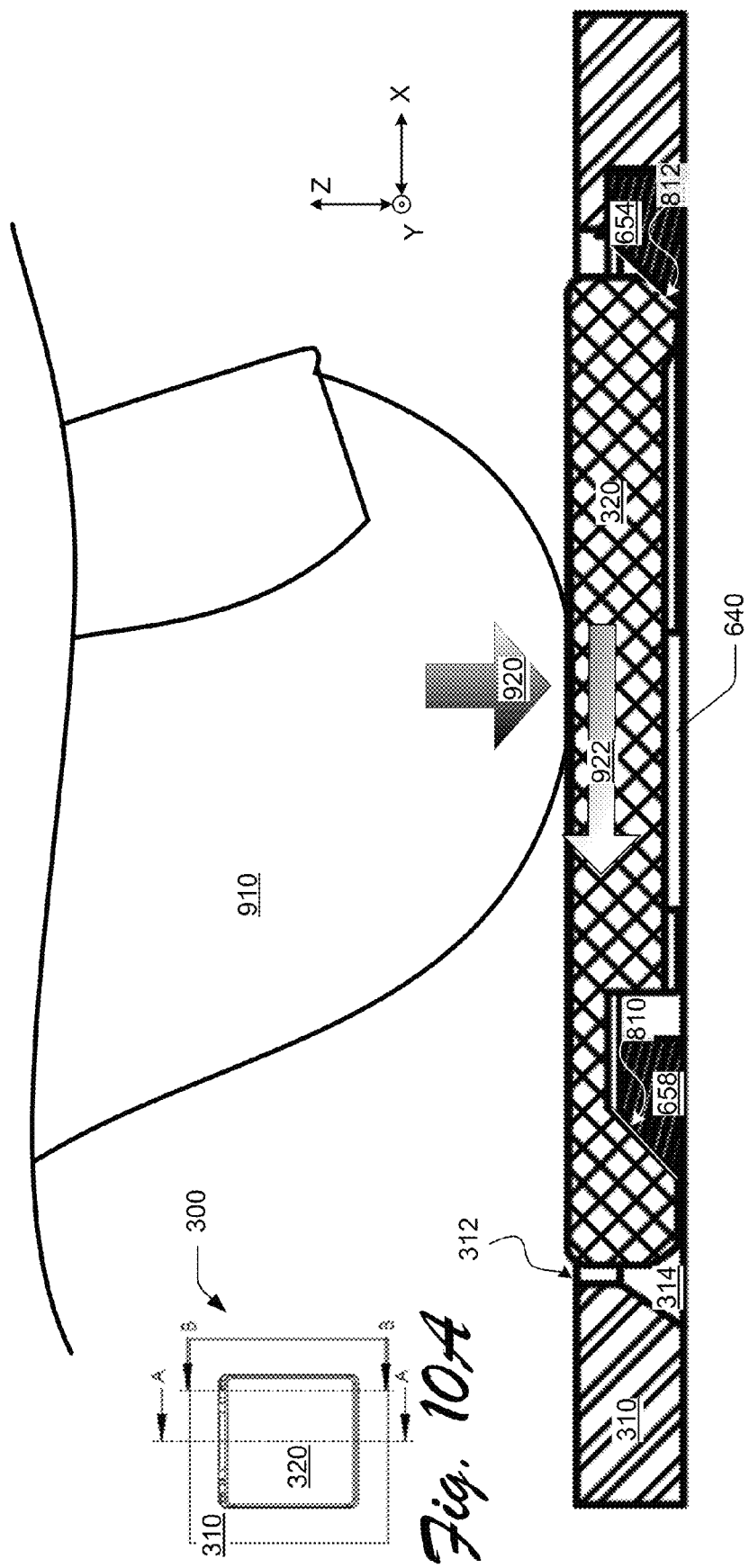

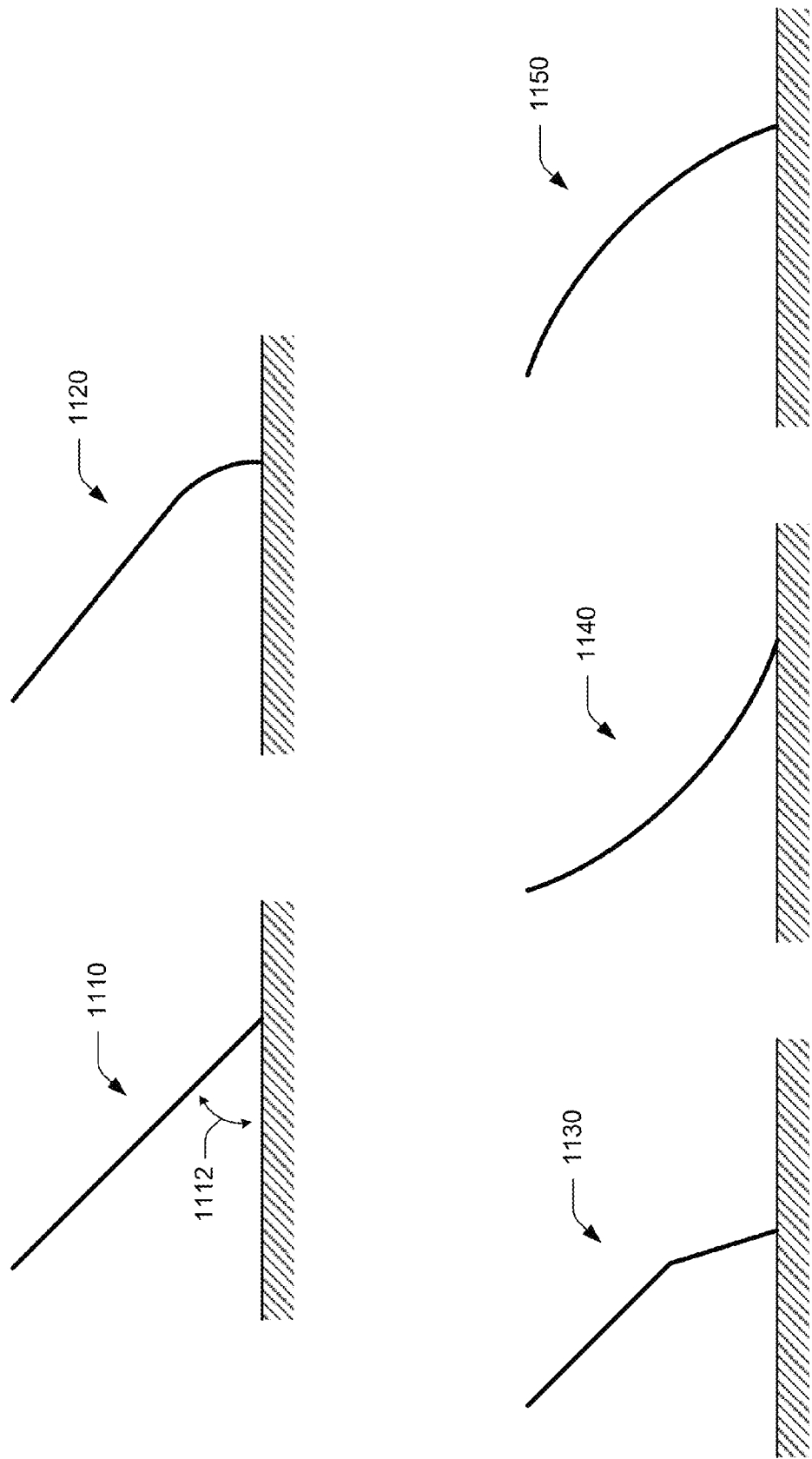

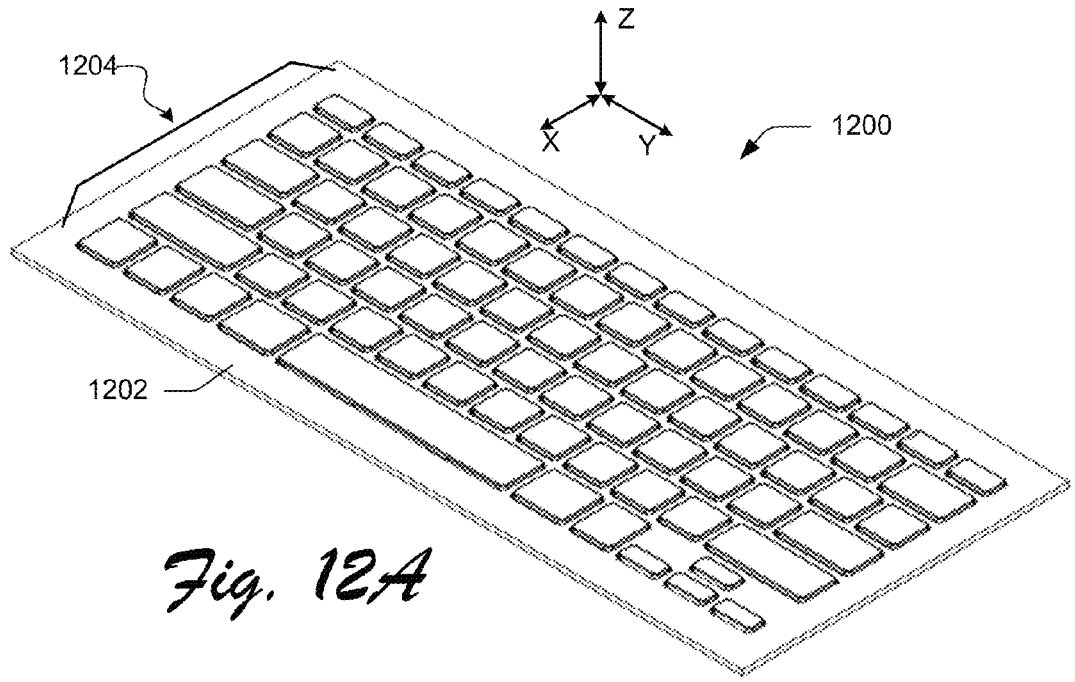
Fig. 12A
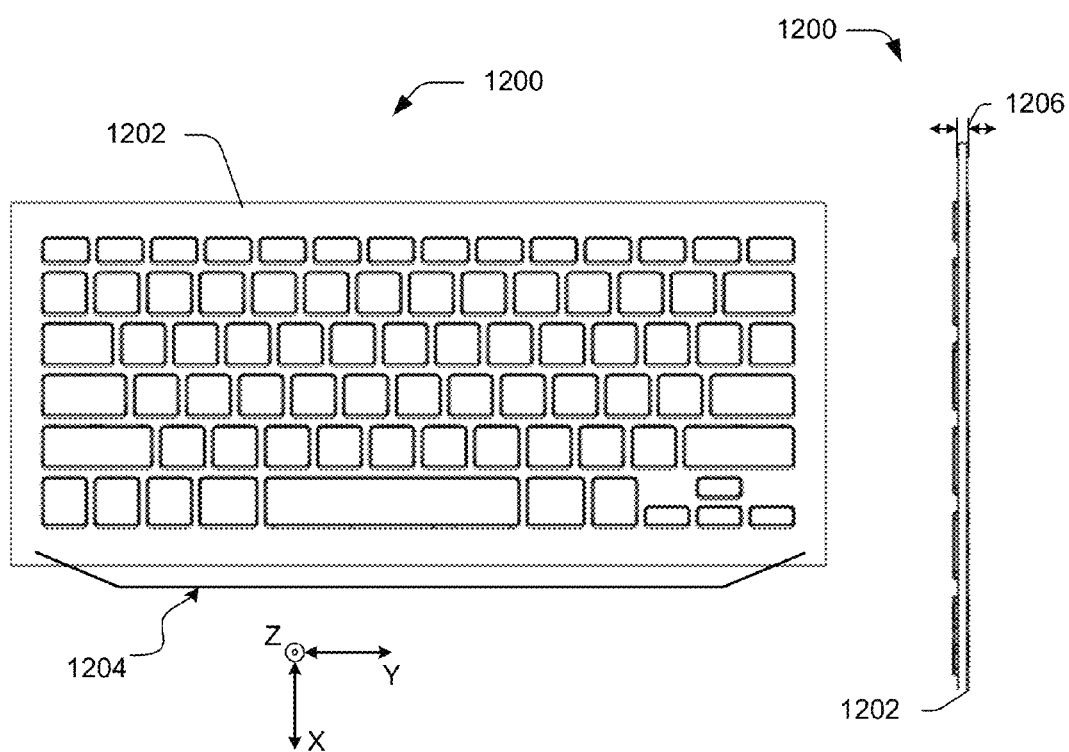
Fig. 12B
Fig. 12C

TOUCHSURFACE WITH LEVEL AND PLANAR TRANSLATIONAL TRAVEL RESPONSIVENESS

RELATED APPLICATIONS

This application is related to and claims the benefit of priority of U.S. patent application Ser. No. 13/198,610, filed on Aug. 4, 2011, is related to and claims the benefit of priority of U.S. patent application Ser. No. 13/323,292, filed on Dec. 12, 2011, and claims the benefit of priority of U.S. Provisional Patent Application Ser. No. 61/429,749, filed on Jan. 4, 2011 and U.S. Provisional Patent Application Ser. No. 61/471,186, filed on Apr. 3, 2011.

BACKGROUND

Depressible keys are widely used in a variety of input devices, including keypads for cellular phone, keyboards for laptop and desktop computers, and kiosks. FIG. 1 illustrates a side elevation view of simplified key mechanics 100 of a conventional keyboard of a typical computer system. The key mechanics 100 include a key 110, a collapsible elastomeric plunger (often called a "rubber dome") 120, a scissor-mechanism 130, and a base 140.

The scissor mechanism 130 includes at least a pair of interlocking rigid blades (132, 134) that connect the key 110 to the base 140 (which may or may not be part of the body of the keyboard). The interlocking blades move in a "scissor"-like fashion when the key 110 travels along its vertical path in the negative direction, as indicated by arrow 150.

The scissor mechanism is disadvantageous in many ways. For example, it may add a degree of mechanical complexity to the key assembly, complicate manufacture and repair, obscure or complicate lighting of the key, and limit how thin a keyboard may be constructed.

SUMMARY

Described herein are one or more techniques related to a touchsurface with level and planar translational travel responsiveness. One or more of the described implementations include an input device having a rigid body including a touchsurface configured to travel along a depression path in response to being depressed by a user. The input device also includes a leveling mechanism that operates in manner to keep the touchsurface substantially level as the touchsurface travels along the depression path in response to being depressed by the user. Furthermore, the input device has a planar-translation-effecting mechanism that defines a planar translation component of the depression path, such that the touchsurface exhibits planar translation as the touchsurface travels along the depression path.

This Summary is submitted with the understanding that it will not be used to interpret or limit the scope or meaning of the claims. This Summary is not intended to identify key features or essential features of the claimed subject matter, nor is it intended to be used as an aid in determining the scope of the claimed subject matter.

BRIEF DESCRIPTION OF THE DRAWINGS

Each of FIGS. 7A and 8A is a top plan view of the second implementation as shown in FIG. 4, with the key assembly shown in the ready position. FIGS. 7A and 8A include additional lines showing where cross-sections are taken for the cross-sectional views of the second implementation shown in FIGS. 7B and 8B.

Each of FIGS. 9A and 10A is a top plan view of the second implementation as shown in FIG. 4, with the key assembly in a pressed position. FIGS. 9A and 10A include additional lines showing where cross-sections are taken for the cross-sectional views of the second implementation shown in FIGS. 9B and 10B.

FIG. 11 shows several examples of ramp profiles that illustrate ramps that may comprise both leveling and planar-translation-effecting mechanisms.

FIGS. 12A, 12B, and 12C are three different views of a keyboard that incorporates one or more implementations of key-based touchsurfaces configured in accordance with the techniques described herein. FIG. 12A is an isometric view, FIG. 12B is a top plan view, and FIG. 12C is a side elevation view.

FIG. 13 depicts the third implementation in an unpressed, ready-to-be-pressed, position (i.e., ready position).

FIG. 18A shows the exemplary key assembly in its unpressed, ready position. FIG. 18B shows the exemplary key assembly in its pressed position.

FIG. 19 shows it in a pressed position.

The Detailed Description references the accompanying figures. In the figures, the same numbers are used throughout the drawings to reference like features and components.

DETAILED DESCRIPTION

Figure 1:
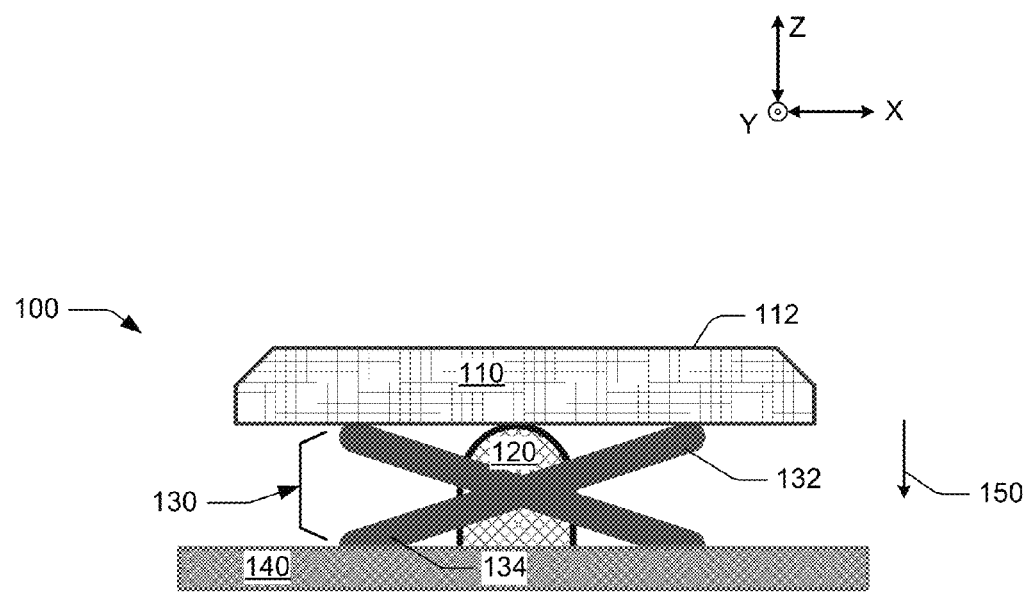
FIG. 1 is a side elevation view of simplified key mechanics of a conventional keyboard.

Described herein are one or more techniques related to a leveled touchsurface with planar translational responsiveness to vertical travel. That is, the techniques are related to effecting translation of the touchsurface along a depression path that includes a component along a press direction (also referred to as "vertical travel" in this application) and a component along a direction orthogonal to the press direction (also referred to as "planar translation" in this application).

Examples of touchsurfaces include a top surface of a key or button, an input surface of an opaque touchpad or a touchscreen, any other surface used for human-machine interactions, and the like. Additional example touchsurfaces are described later in this document. With the techniques described herein, the touchsurface can be kept in a level orientation, such that it does not substantially pitch, roll, or yaw when the touchsurface is moved from unpressed to depressed positions. The touchsurface may or may not pitch, roll, or yaw when it moves from pressed to unpressed positions.

Embodiments comprise leveling mechanisms that keep the touchsurface level when depressed, and planar-translation-effecting mechanisms that impart planar translation while the touchsurface travels "vertically" in response to pressing force.

At least one implementation described herein involves an ultra-thin keyboard with leveled keys having planar translational responsiveness to vertical travel. When a user presses a key, the key remains level in its orientation during its vertical travel. That is, the key (especially its touchsurface, located on the keytop) remains relatively level during its motion during the press. The leveling technology described herein reduces or eliminates any wobbling, rocking, or tilting of the keytop during a keypress.

A prototype key deflected only 0.036 mm when a force of forty grams was applied to a left side of the key. The deflection on both the left and right sides were measured and the magnitude of one was subtracted from the magnitude of the other to calculate the tilt deflection. With this test, the prototype key experienced about one-sixth of the tilt deflection of the conventional key.

With the techniques described herein, the touchsurface is configured to move along a depression path with components in a press direction and also in a plane orthogonal to the press direction. The depression path is the path followed by a reference point on the touch surface from unpressed to pressed positions. In some embodiments, the reference point is a central point, such as a center of mass, a geometric center, and the like. In some embodiments, the reference point is a location of press force application.

The press direction is the one that users consider "vertical" (often "downwards") for the touchsurface. The press direction is often orthogonal to the touchsurface and towards an internal region of the system comprising the touchsurface. This overall touchsurface motion may be referred to as "diagonal", since the overall motion includes both "vertical" and "lateral" components. This is even though the actual path following by the touchsurface may not be a straight line. Example paths may be linear, nonlinear, or piecewise linear. Thus, example paths may follow straight lines, arcs, simple or complex curves, etc.

In addition, at least as it travels downward along the depression path, the touchsurface is constrained from pitch and roll so that it stays level or substantially level in response to a press. Substantially level includes, for example, the touchsurface exhibiting little or no rotation, wobble, tilt, yawn, and the like while the touchsurface moves along the depression path in response to a press. Thus, average users pressing the touch surface do not perceive rotation, wobble, tilt, yawn, and the like of the touchsurface to a degree that distracts from the typical experience when, for example, typing on a conventional keyboard.

In some implementations, the touchsurface is more than substantially level. It is level. That is, at least as it travels downward along the depression path, the touchsurface is constrained in such a manner that the touchsurface exhibits little or no rotation, wobble, tilt, or yawn of any form when moving along the depression path in response to a press. In such implementations, typical human perception (e.g., visual or somatosensory perception) is unable to detect any rotation, wobble, tilt, yawn, or the like of the touchsurface without the aid of a mechanical or electronic device.

The examples herein often use a Cartesian coordinate system for ease of explanation. In this case, the press direction may be referred to as the "Z-direction," "vertical," or "down or up," and the lateral directions may be referred to herein as the "X/Y"-direction, "horizontal," "left or right", "back and forth", and "planar." Often, the press direction is described as "downwards," in the negative Z-direction. With this Cartesian coordinate system, the touchsurface configured in accordance with the techniques described herein translates in the X-Y plane even as it is pressed downwards in the negative Z-direction. In the embodiments described herein, this planar translation mostly focuses on translation in the positive-X direction. In various embodiments, the planar translation may comprise translation in the positive or negative X-direction, in the positive or negative Y-direction, or a combination thereof.

Using the Cartesian coordinate system, the touchsurface moves "diagonally" in response to a press by exhibiting movement that includes both a "Z" (or vertical) translation component as well as "X-Y" (or planar) translation components. The X-Y components together may be called "planar translation", since it is within the X-Y plane. This planar translation occurs in response to the vertical travel of the touchsurface, and may be called "planar translational responsiveness to vertical travel" of the touchsurface (or "planar-translation-responsiveness-to-vertical-travel").

In some embodiments, the touchsurface comprises a surface of a rigid body, such as that of a rigid rectangular body having greater width and breadth (i.e., X/Y dimensions) than depth (i.e., Z-dimension). In various embodiments, the touchsurface comprises a surface of a different shape, such as that of circles, trapezoids, and triangles, polygons with substantively rounded corners, etc. In various embodiments, the touchsurface comprises a surface of a pliant body.

The planar component of the planar translational responsiveness to vertical travel produces a tactile illusion of the touchsurface traveling a larger vertical distance than that which it actually travels. Moreover, after the downward press of the touchsurface, the touchsurface returns to its ready position using, for example, magnetic forces. The movement of the key against a user's finger as the key returns to its ready position also aids in the illusion.

For example, when the user presses an exemplary key on an embodiment of a keyboard employing the planar-translation-responsiveness-to-vertical-travel techniques described herein, the key travels in the negative Z-direction (e.g., down) a short distance (e.g., 0.5 to 1.0 millimeters) and returns that same distance when released. During its Z-direction travel, this exemplary key also travels in a lateral or planar direction (e.g., X/Y-direction) approximately the same distance. Of course, the planar direction of travel in proportion to the Z-direction travel may vary with differing implementations.

Although the key only traveled a shorter distance in the Z-direction, the user perceives that the exemplary key traveled a greater distance in the Z-direction. For example, in some embodiments, some users may perceive that the exemplary key traveled one-to-two or two-to-three times further in the negative Z-direction than the distance that the key actually did. That perception of extra Z-travel is due in large part to the tangential force imparted on the user's fingertip by the lateral or planar translation of the key during the Z-direction keypress.

The planar-translation-responsiveness-to-vertical-travel technology introduced herein takes advantage of a tactile perceptional illusion where a person misinterprets an atypical force experience of his fingertip as a typical force experience. For example, with the exemplary keyboard described above, when a person presses and releases a key of that keyboard, the person feels a force normal to his fingertip and tangential, lateral forces. These tangential forces are interpreted as normal forces by the person. In this way, the person obtains a "feel" of a typical key travel of the keys of the keyboard. This is so, at least in part, because most humans cannot somatosensorially perceive directionality for sufficiently small motions but can still perceive relative changes in force due to skin shear.

With the planar-translation-responsiveness-to-vertical-travel techniques discussed herein, the combination of normal and lateral forces exerted on the user's fingertip during a keypress simulates for the person a key that has traveled much farther in the negative Z-direction than it actually did. For example, a key of an exemplary keyboard with only a negative Z-direction key travel of about negative 0.8 mm and an appropriate amount of lateral motion may feel more like the key is traveling 1.5 mm, 2.0 mm, or more in the Z-direction. Consequently, thin keyboards of less than 3.0 mm thickness may be constructed without sacrificing the "feel" of a quality full travel keyboard.

Furthermore, the techniques described herein employ a ready/return mechanism designed to hold, retain, and/or suspend the key in a position where it is ready to be pressed by a user and also return the key back to its unpressed, ready-to-be-pressed (i.e., ready position) after the pressing force is removed. With at least one implementation described herein, this is accomplished by employing a set of magnets arrayed to be mutually attractive or attractive to ferrous material integrated with the key or base. The magnets hold the key in the ready position and pull the key back into the ready position after there is no longer a sufficient downward force to keep it pressed. Other embodiments may use any of a variety of other ready/return mechanisms.

While the implementations discussed herein primarily focus on a key and a keyboard, those of ordinary skill in the art should appreciate that other implementations may also be employed. Thus, descriptions associated with keys may be mapped to touchsurfaces other than those on keys. Examples of such non-key or non-keyboard implementations include those described later in this document.

Exemplary Key Assemblies

Figure 2A:
FIG. 2A is a simplified elevation view of a first implementation of a touchsurface configured in accordance with the techniques described herein. The first implementation is an exemplary key assembly, and is shown in FIG. 2A in an unpressed, ready-to-be-pressed, position (i.e., ready position).
Figure 2B:
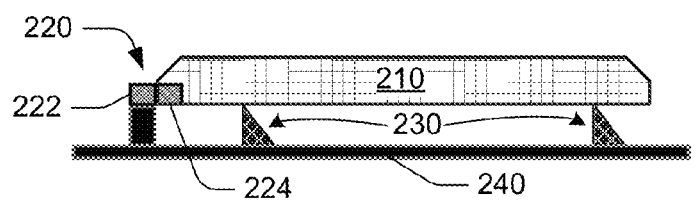
FIG. 2B is an elevation view of the first implementation in a partially depressed position.
Figure 2C:
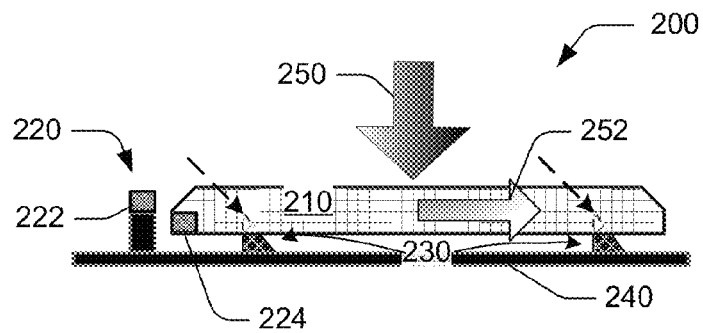
FIG. 2C is an elevation view of the first implementation in a pressed position.

FIG. 2A shows a simplified elevation view of an exemplary key assembly 200 in an unpressed, ready-to-be-pressed position (i.e., ready position). FIGS. 2B and 2C show the same key assembly 200 in its progression to a pressed position. The key assembly 200 is configured to implement the techniques described herein to provide a tactile user experience of a touchsurface (here, a key surface) with leveling, planar translation responsiveness to vertical travel.

The key assembly 200 includes a key 210, a ready/return mechanism 220, a leveling/planar-translation-effecting mechanism 230, and base 240. The key 210 is a specific implementation of the touchsurface that the user touches to interface with a computer. As discussed earlier, in other implementations, the touchsurface may be of something other than a key.

The components of the key assembly 200 may be made from any appropriate material, including plastics such as acetal, metals such as iron or aluminum, elastomers such as rubber, and the like. In various embodiments, the key 210 is configured to be substantially rigid, such that the touchsurface of the key 210 appears to unaided human senses to be in the same shape and to move without deformation, and with rigid body motion, to unaided human senses.

The ready/return mechanism 220 is configured to hold the key 210 in its ready position so that the key is ready to be pressed by a user. In addition, the ready/return mechanism 220 is configured to return the key 210 back into its ready position after the key 210 is depressed and released. As shown, the ready/return mechanism 220 accomplishes these tasks by the use of one or more pairs of magnets (stationary magnet 222 and key magnet 224) arranged to attract each other. In particular, the stationary magnet 222 is built into a perimeter of a bezel or housing defining a hole or space (which is not depicted in FIGS. 2A-2C) that receives the key 210 when depressed. The key magnet 224 is positioned in and/or under the key 210 in a manner that corresponds with the stationary magnet 222 and in a manner so that the two magnets 222, 224 are mutually attractive.

The mutual attraction of the magnets of the ready/return mechanism 220 holds the key 210 in its ready position as depicted in FIG. 2A. Of course, alternative implementations may employ different mechanisms or combinations of mechanisms to accomplish the same or similar functionality. For example, alternative implementations may replace stationary magnet 222 or key magnet 224 with a ferrous, non-magnetic material such as various iron alloys. As additional examples, alternative implementations may employ electro-magnets, springs such as compression or leaf springs, hydraulics, pneumatics, elastomeric material such as elastomeric domes, etc. In addition, implementations may push or pull the key 210 to return the key 210 to its ready position. Additional alternative ready/return mechanisms are discussed later in this document.

The amount of vertical force necessary to break the magnetical coupling can be customized based upon the size, type, shape, and positioning of the magnets involved. In some implementations, breakaway force ranges from forty to a hundred grams.

The key assembly 200 includes a leveling/planar-translation-effecting mechanism 230 located under the key 210. Mechanism 230 is capable of performing both leveling and planar-translation-effecting functions. Thus, the mechanism 230 levels the key 210 and/or imparts a planar translation to the key 210 while it is depressed, depending on the details of the key assembly 200. For the key assembly 200, the leveling/planar-translation-effecting mechanism 230 includes multiple inclined planes or ramps (two of which are shown in FIGS. 2A-2C). The ramps are distributed about the perimeter of the underside of the key 210 in such a manner as to evenly support the key 210 when a pressing force is placed on the key. In this way, the surface of key 210 remains level during a keypress.

In at least one implementation, key 210 is a rectangular key, and mechanism 230 has four ramps, each positioned under one corner of the rectangular key.

In some implementations of mechanism 230, at least one ramp is positioned in the interior region of the underside of the key 210 and provide interior support for the key surface. In some implementations of mechanism 230, at least one ramp is positioned outside the periphery of the key 210, and key 210 comprises extension arm(s) that ride and rest on the ramp. In various implementations of mechanism 230, any number of ramps may be used with key 210. For example, a rectangular key may be matched with three ramps, four ramps, five ramps, or other numbers of ramps. In some embodiments, other structures are positioned inside the perimeter of the underside of the key 210 to provide additional support to the key 210.

As shown in FIG. 2B and as is typical of a key when pressed, the key 210 moves in a negative Z-direction when a pressing force 250 is applied to the top of the key 210. In response, the key 210 moves in a lateral direction (motion in the X-direction is indicated in FIG. 2) as well as in a vertical direction downwards. The key 210 rides the ramps of the leveling/planar-translation-effecting mechanism 230 downwards during the keypress, effectively using them as bearings. In so doing, the ramps impart a lateral force component and lateral motion, as represented by planar vector 252, onto the key 210.

In addition, FIGS. 2B and 2C show the magnets 222, 224 of the ready/return mechanism 220 separating in response to the translation of the key 210. The attractive force of the magnets 222, 224 provides an additional degree of resistance to the initial keypress. This initial resistance and the ultimate breakaway of the magnets 222, 224 can be configured to contribute to the feel of the breakover portion of the snapover feel of a traditional full-travel key. A discussion of the snapover feel of a traditional full-travel key can be found in the co-owned U.S. Provisional Patent Application Ser. No. 61/429,749, filed on Jan. 4, 2011.

FIG. 2C shows the key 210 depressed to an extent that the key 210 contacts the base 240 (or some other component that is not shown but disposed on the base 240—such as a physical limiter, an electronic switch). Not shown in FIG. 2C is the sensor(s) used to detect that key 210 has been depressed. The sensor(s) may be based on any appropriate technology, including capacitive, resistive, inductive, and optical sensors, and also mechanical keyswitches. Thus, any suitable key switch or other sensor may be employed for the techniques described herein.

Furthermore, as part of a sensor system of one or more implementations, the 210 may have a conductive portion (e.g., the key magnet 224) as part of a capacitive keyswitch sensor system. Such a system may include a capacitive sensor electrode positioned underneath the key 210 so that the capacitive sensor electrode may capacitively couple with the conductive portion of the key and define a variable capacitance. The motion of the key as the key is pressed (i.e., along the depression path) changes the variable capacitance.

When the pressing force is removed (e.g. when the user lifts the pressing finger from the key 210) after the key 210 has been depressed, there is no longer a sufficient pressing force on the key 210 to keep it depressed. In that situation, the ready/return mechanism 220 returns the key 210 to its ready position as depicted in FIG. 2A. The attractive forces between the magnets 222, 224 pulls the key 210 back up the ramps of the leveling/planar-translation-effecting mechanism 230. Once the magnets 222, 224 return to their original position, the key 210 is in its ready position (as depicted in FIG. 2A) and the key 210 is ready to be depressed again.

Figure 3:
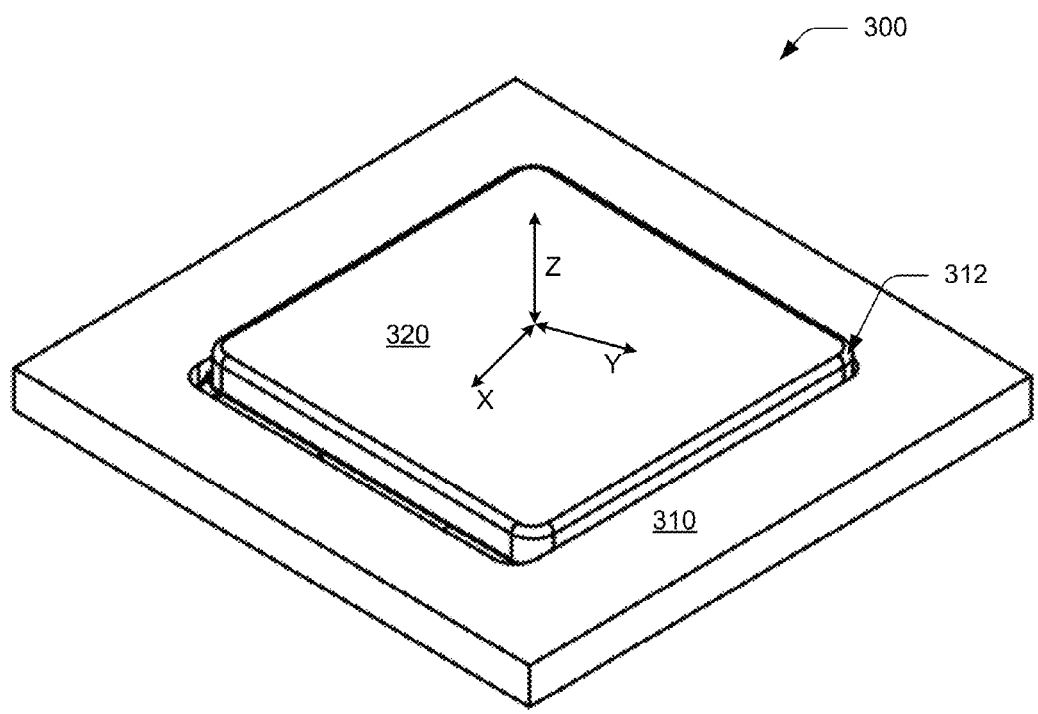
FIG. 3 is an isometric view of a second implementation configured in accordance with the techniques described herein. The second implementation is an exemplary key assembly, and is shown in an unpressed position.

FIG. 3 is an isometric view of another exemplary key assembly 300 configured to implement the techniques described herein and provide leveled touchsurface with planar translational responsiveness to vertical travel. The key assembly 300 includes a key podium 310 and a key 320. As depicted, the key 320 is shown in its ready position relative to the podium 310. In the ready position, the key 320 sits above the podium 310. Indeed, the key 320 is suspended over and/or at least partially within a keyhole 312 (which is a key-shaped cavity) in the podium 310. The key podium may also be called a keyframe or bezel.

From top to bottom, the key assembly 300 is about 2.5 mm thick. The key podium 310 is about 1.5 mm thick and the key 320 is about 0.75 mm thick. The key 320 is about 19 mm by 19 mm and the keyhole is slight larger at 19 mm by 20 mm. Of course, the dimensions may differ with other implementations.

Each of the double-headed arrows X/Y/Z, as shown in FIG. 3, indicate an axis of a three-dimensional Cartesian coordinate system that can be used to describe the motion of the key 320.

Figure 4:
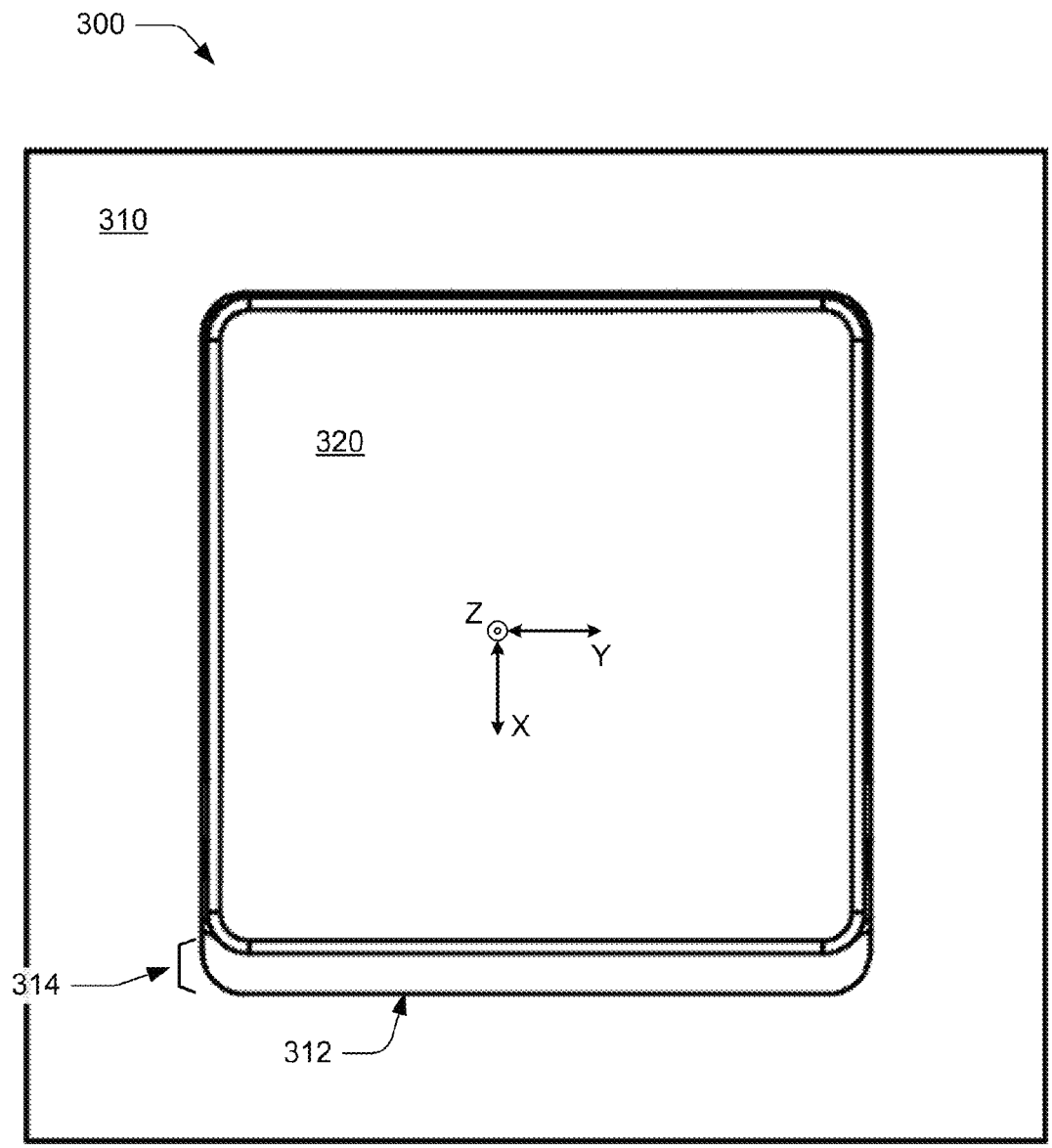
FIG. 4 is top plan view that illustrates the second implementation.

FIG. 4 is a top plan view of the key assembly 300 with its podium 310 and key 320. As seen from above, the keyhole 312 fits the key 320 snuggly except for one side where a lateral-movement gap 314 is shown. The gap 314 may be about 1.0 mm, and allows some space for the key 320 to travel laterally. In one or more implementations with such a gap, the dimension of the gap is just sufficient to allow for the planar translation.

Figure 5:
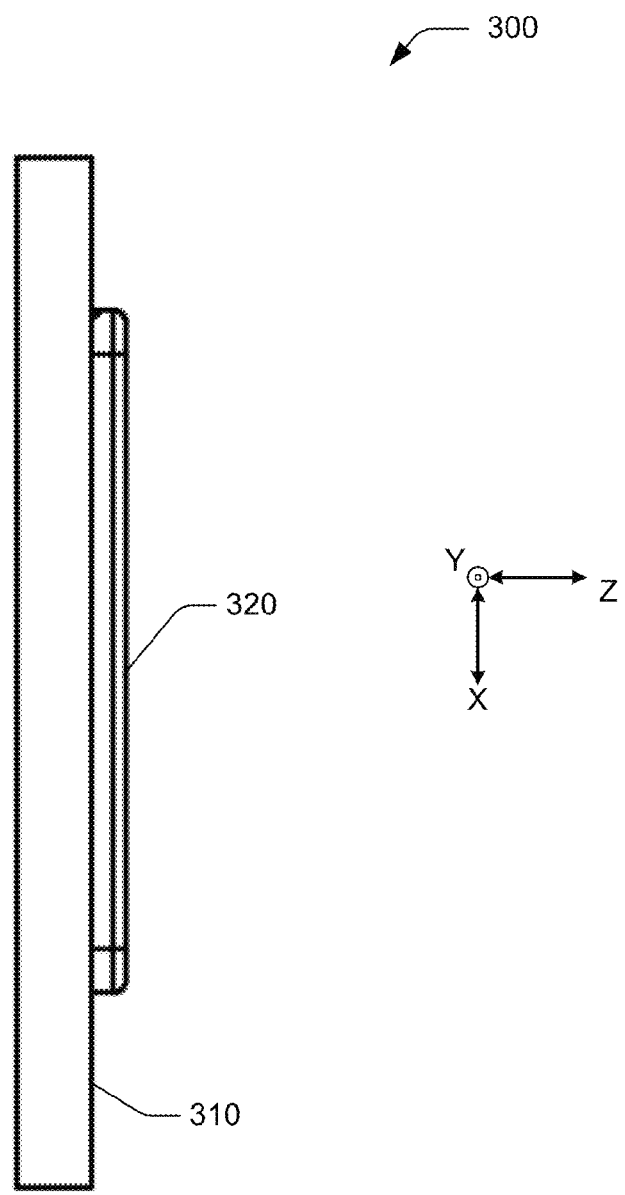
FIG. 5 is a side elevation view that illustrates the second implementation.

FIG. 5 is a side elevation view of the key assembly 300 with its podium 310 and key 320.

Figure 6:
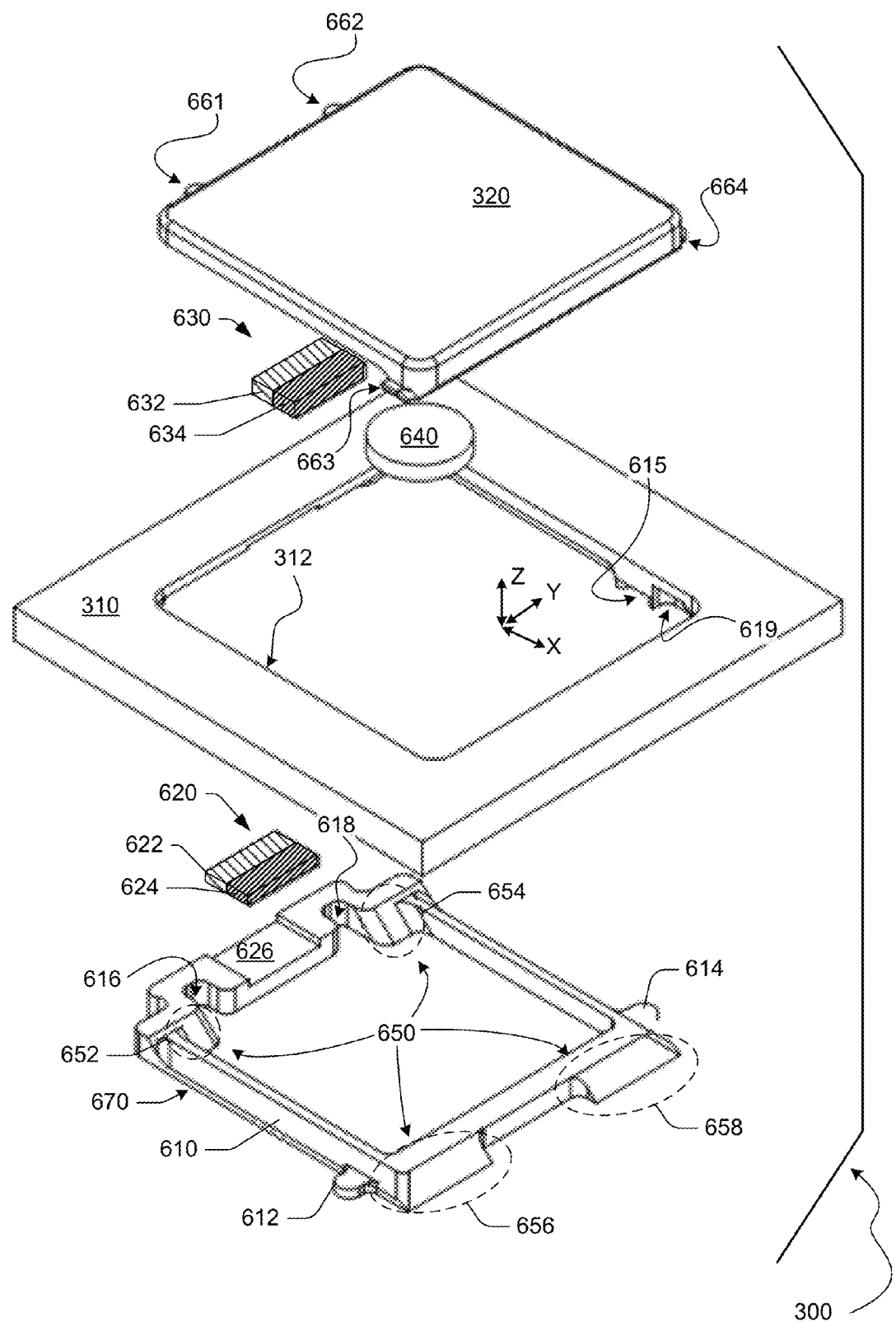
FIG. 6 is an exploded isometric view that illustrates the second implementation.

FIG. 6 is an exploded view of the key assembly 300 with its podium 310, key 320, and keyhole 312. This figure also shows a key guide 610, a podium magnet 620, a key magnet 630, and a key hassock 640.

The key guide 610 is designed to fit into and/or under the key podium 310. Where the key guide 610 is not integral with the key podium 310 in operation, the key guide 610 may be aligned with the key podium 310 in any appropriate way, including the use of various alignment features. Where the key guide 610 is integral with the key podium 310 in operation, the key guide 610 may be made as a separate piece that is later assembled with the key podium 310. Any appropriate attachment method may be used, including adhering, snap fits or other mechanical interference fits, heat staking, fastening with mechanical fasteners, etc. FIG. 6 shows guide-mounting tabs 612 and 614 of the key guide 610 fit into corresponding tab-receiving cavities in the podium 310. One of such cavities is visible in FIG. 6 at 615. Alternatively, the key guide 610 and the key podium 310 may be formed as parts of the same piece of material.

In key assembly 610, the podium magnet 620 is mounted into the key podium 310 by fitting the magnet into a recess 626 formed between the key guide 610 and the key podium 310. In some embodiments, the recess 626 is smaller than the podium magnet 620, and the podium magnet 620 is held in the recess 626 through a press fit. In some other embodiments, the recess 626 is as large as, or larger than, the podium magnet 620, and the podium magnet is held in place by other means. The two magnetic poles of podium magnet 620 are illustrated as differently shaded sections 622 and 624. The podium magnet 620 is mounted in such a way as to magnetically expose one pole (e.g., pole 624) to the interior of the keyhole 312. That is, the magnets 620 is disposed such that magnetic field lines from the pole 624 extend toward the interior of the keyhole 312.

While FIG. 6 shows the podium magnet 620 as a single magnet, the podium magnet 620 may be an assembly comprising a plurality of magnets, and comprise more than one magnet. Where the podium magnet 620 comprises a plurality of magnets, that plurality of magnets may be called the "podium-magnet arrangement". In various implementations, there may be two, three, or more magnets stacked together in a podium magnet arrangement.

The key magnet 630 is held in a recess under and/or in the key 320 using any appropriate method, including those discussed in conjunction with the podium magnet 620. This key magnet 630 has two poles (632, 634). One pole (632) is magnetically exposed to the interior wall of the keyhole 312 when the key 320 is within and/or over the keyhole 312 (e.g., in the ready position). The pole 632 is opposite to the pole 624.

While FIG. 6 shows the key magnet 630 as a single magnet, the key magnet 630 may be an assembly comprising a plurality of magnets, and comprise more than one magnet. Where the key magnet 630 comprises a plurality of magnets, that plurality of magnets may be called the "key magnet arrangement". In various implementations, there may be two, three, or more magnets in a key magnet arrangement.

Collectively, the key-magnet arrangement and the podium-magnet arrangement work together to keep the key 320 in a ready position, return the key 320 to the ready position, or both. Consequently, these magnet arrangements comprise a ready/return mechanism. In addition, the magnet arrangements may offer a degree of resistance to the initial downward force of a keypress. In this way, the magnet arrangements can contribute to the satisfactory approximation of a snap-over of a full-travel key of a keyboard.

Many variations on the ready/return mechanism of key assemble 300 are possible. For example, any of the key or podium magnets may be disposed so that the poles are aligned with the Y or Z axes, such that both poles are magnetically exposed to the interior of the keyhole.

For example, some embodiments may utilize a podium magnet arrangement comprising multiple magnets disposed at different locations around the keyhole 312 and at various Z-heights. Counterpart key magnets of a key magnet arrangement may be disposed in appropriate matching locations. This plurality of matching magnets may be configured to facilitate lateral translation of the key during a press or release, adjust the path of travel during a press or release, increase the attraction force, shape the magnetic forces applied at different points of the path of travel, etc.

As another example, the ready/return mechanism may comprise non-magnetic components instead, or in addition to, the podium magnet 620 and the key magnet 630. As a specific example, the podium magnet 620 or the key magnet 630 may be replaced by a ferrous material. As yet another example, the ready/return mechanism may be based on techniques other than magnetic attraction, such as any of the other ready/return techniques described herein.

The key hassock 640 is attached to the underside of, and at a central region, of the key 320. In this case, the hassock 640 has dual purposes. First, the hassock 640 aids in making a clean and reliable contact with a key switch (which is not shown) when the key 320 is fully pressed. The hassock 640 provides an unobstructed flat area for facilitating detection of keypresses. Where the key assembly 300 utilizes capacitive sensing technology for sensing key presses, the hassock 640 may also contain electrodes for facilitating sensing. Where the key assembly 300 utilizes membrane switch technology for sensing key presses, the hassock 640 may be configured with proper shapes and cushioning responses to provide reliable switch closure of a membrane keyswitch in response to key presses. Second, the hassock 640 provides a predetermined amount of cushioning (or lack thereof) at the bottom of the keypress to provide a satisfactory tactile response, such as an approximation of a snap-over associated with a full-travel key of a keyboard. Other implementations may use other techniques for sensing a key press and providing tactile feedback, including any of the examples described herein, which may or may not utilize a key hassock.

The key 320 has a set of key-retention tabs 661, 662, 663, 664 that are designed to retain the key in the ready position. In the ready position, the key-retention tabs 661, 662, 663, 664 fit into corresponding tab-receiving cavities in the formed cavities between the podium 310 and the key guide 610. Portions of three of such cavities are visible in FIG. 6 at 616, 618 and 619. Cavities 616 and 618 are designed to receive key-retention tabs 661 and 662. Cavity 619 is designed to receive key-retention tab 664. Podium 310 acts as a retaining component that covers these cavities and captures the tabs therein, such that the key podium is more likely to stay in the ready position.

The key guide 610 has a key-guiding mechanism 650 built therein. The key-guiding mechanism 650 is a type of combination leveling/planar-translation-effecting mechanism. The key-guiding mechanism 650 includes key-guiding ramps 652, 654, 656, and 658. These ramps are positioned towards the four corners of the key guide 610. Not shown in FIG. 6, inverse and complementary ramps are built into the underside of key 320. For ease of explanation, the ramps of key guides (and similar components) are referred to as "ramps," and the ramps of the keys (and similar components) are referred to as "chamfers" herein.

The key's chamfers slide down the key-guiding ramps during a downward keypress. Regardless of where on the key 320 that a user presses, the chamfer-ramp pairings in each corner keep the key 320 steady and level during a keypress. Therefore, the chamfer-ramp pairings level the key 320 and is a leveling mechanism, and may be called the key leveler.

A structure, such as a guide and rail system, may be used to further limit movement of the key 320 in the X or Y direction and/or rotation about the Z-axis. An arm structure 670 of the key guide 610 functions as a rail system to limit X-direction or Y-direction movement and rotation about the Z-axis. In an exemplary guide and rail system, protrusions such as pins extending from the key 320 is configured to ride on the rail system.

In general, the purpose of the key leveler is to reduce or eliminate wobbling, rocking, or tilting (pitch, yaw, roll rotation) of the key during a keypress. In the key assembly 300, the arm structure 670 and the mating key-retention tabs and cavities function, at least in part, to help prevent the rotation of the key 320 about the Z-axis.

In addition, the chamfer-ramp pairings effectively translate at least some of the user's downward force into lateral force. Thus, the chamfer-ramp pairings convert the negative Z-direction force of the key 320 into both negative Z-direction (vertical) and X/Y direction (lateral) movement. Since the key-guiding mechanism 650 also translates negative Z-direction (i.e., vertical) force into X/Y direction (i.e., planar) movement, the key-guiding mechanism 650 may also be called a vertical-to-planar force translator.

FIGS. 7B and 8B are cross-sectional views of the key assembly 300 with the key 320 shown in its ready position. FIG. 7B shows the cross-section taken at about the center of the key assembly (which is along line A-A as shown in FIG. 7A). FIG. 8B shows the cross-section taken off-center of the key assembly (which is along line B-B as shown in FIG. 8A). For context, in these drawings, a user's finger 710 is shown hovering over the key 320 shortly prior to pressing down on the key.

The vast majority of parts and components of the assembly 300 shown in FIGS. 7A, 7B, 8A, and 8B were introduced in FIG. 6. The cross-sectional view shows the arrangement of those already introduced parts and components.

As depicted in both FIGS. 6 and 7B, the pole of the exposed end 632 of the key magnet 630 is the polar opposite of the exposed end 624 of the podium magnet 620. Because of this arrangement, the key magnet 630 of the key 320 is attracted towards magnet 620 of the key podium 310. Consequently, the magnetic attractive forces hold the key 320 against the podium 310 with sufficient force such that the key 320 is substantially horizontal even though it is held in a cantilevered fashion in its ready position. This cantilevered arrangement of the ready position of the key 320 is depicted in at least FIG. 7B.

In addition to the parts and components of the assembly 300 introduced in FIG. 6, FIG. 7B introduces a backlighting system 720 with one or more light emitters 722. The lighting sources of the backlighting system 720, as depicted, are implemented with a light emitter 722 per key. A light bulb is used to represent the light emitter 722 in FIG. 9B, although light emitter 722 may be realized with components other than light bulbs in practice, and although implementation of the backlighting system 720 may involve no light bulbs.

Key lighting systems can be implemented using any suitable technology. By way of example and not limitation, light can be provided by light generators such as light bulbs, LEDs, OLEDs, LCDs or other displays, and/or electroluminescent panels to name just a few. In addition, light may be directed from a light generator by light guides such as light pipes and fiber optic mats. For example, some implementations use a light guide in the form of a sheet of material underlying the keys. One or more light emitters are disposed on the sheet, on one or more sides of the sheet, or both. The sheet may comprise a reflective backing to better guide the light. The sheet may comprise light diffusers located under keys to direct light outwards through the keys, or proximate keys to direct light outwards between or around the keys.

In some embodiments, the backlighting system is configured such that different keys are backlit differently, with different colors, brightness, intensities, locations in the key, etc. The processing system communicatively coupled to and used to operate the backlighting system may also be configured to dynamically change these or other backlighting parameters over time. This dynamic backlighting can be used to provide information to a person viewing the backlighting, including providing feedback for particular user input (such as lighting up in response to a touch or press on a key), highlighting particular keys that are pressed or may be pressed, indicating system status, etc.

In various embodiments, the backlighting of the keys employing the techniques described herein is facilitated by none or few light-impeding obstructions between the light source (e.g., backlighting system 720) and the key (e.g. key 320). For example, backlighting of keys employing the techniques described herein need not accommodate scissor mechanisms found in conventional keyboards. Consequently, the light emanating from below the key 320 reaches the keytop of the key 320 with little or insignificant impedance, or at least with less impedance as compared to various conventional keyboards. This can allow, for example, key legends to be illuminated for the user.

FIG. 8B shows, in cross-section, two of the chamfers 810, 812 built into the underside of key 320. Chamfer 810 is the inverse of the ramp 658 of the key guide 610, and faces the ramp 658. Similarly, chamfer 812 is the inverse of the ramp 654 of the key guide 610, and faces the ramp 654. The other ramps 652, 656 also face matching chamfers (not shown). When a pressing force is imposed upon the key 320 by, for example, finger 710, the key 320 rides the key guide 610 down to the bottom of the keyhole 312. More precisely, the chamfers and ramps working together convert at least some of the downward (i.e., negative Z-direction) force on the key 320 into a planar or lateral force on the key 320. Consequently, the key 320 moves downward into the keyhole 312 and moves laterally into the lateral-movement gap 314.

Alternatively, the key 320 have pins instead of chamfers; in this scenario, each pin (or plurality of pins) matched to a ramp would ride along the corresponding ramp of the key guide 610. With this approach, multiple keys in the same device can be made the same, saving on design and tooling costs. Also, key guides for different keys may comprise ramps with different ramp profiles. These different ramp profiles may be configured to provide different tactile responses for the different keys.

Alternatively still, the key guide 610 may have pins instead of ramps; the chamfers of the key 320 would then ride on corresponding pins. With this approach, different keys may be produced with chamfers having differing chamfer profiles, enabling reconfigurable profiles by swapping out keys.

FIGS. 9B and 10B are cross-sectional views of the key assembly 300 with the key 320 shown in a pressed position after a press. FIG. 9B shows the cross-section taken at a center of the key assembly (along line A-A as shown in FIG. 9A). FIG. 10B shows the cross-section taken off-center of the key assembly (along line B-B as shown in FIG. 10A). For context, in these drawings, the user's finger 710 is shown pressing the key 320 down into the keyhole 312.

FIGS. 9A, 9B, 10A, and 10B correspond to FIGS. 7A, 7B, 8A, and 8B, respectively. While FIGS. 7A, 7B, 8A, and 8B show the key 320 in its ready position (where it is positioned over and/or in the keyhole 312) in anticipation of a keypress, FIGS. 9A, 9B, 10A, and 10B show the key 320 at the end of a keypress and thus at the end of the keyhole 312. For the sake of simplicity, the backlighting system is shown only in FIGS. 7B and 9B.

As shown in FIGS. 9B and 10B, a negative Z-direction force (as indicated by vector 920) applied by finger 710 onto the key 320 imparts an X/Y-direction movement (as indicated by vector 922) on the key 320. The X/Y-direction movement results from lateral forces resulting from the vertical-to-planar force translator. In key assembly 300, the vertical-to-planar force translator is implemented by the chamfer-ramp relationships of the key 320 to the key guide 610. This force translation is based on the reactive normal force from the ramp including a component in the X/Y direction.

In the embodiment shown in FIGS. 7-10, when the user lifts the finger 710 from the key 320, the magnetic attraction between the opposite poles (632 and 624) of the key and podium magnets (630 and 620) pulls the key 320 back up the ramps 652, 654, 656, 658 to its ready position. That is, when the pressing force is released from the key 320, the key 320 moves from the position depicted in FIGS. 9A, 9B, 10A, and 10B to the ready position depicted in FIGS. 7A, 7B, 8A, and 8B.

As described above, the key guide 610 is fixed under the podium 310 in this embodiment. The key 320 moves both laterally (X/Y-direction) and vertically (Z-direction) in response to a press and when returning to its ready-position.

In other embodiments, the key guide is configured to move laterally while the key is constrained to move substantially vertically. With this alternative scenario, the downward press on the key does not cause lateral motion of the key. Instead, the key's downward motion applies a lateral force on ramps of the key guide and pushes the key guide to move laterally. A ready/return mechanism based on similar principles to those disclosed herein may be used to returns the key guide 610 to its original position and the key 320 to its ready position.

This alternative implementation may be used in various embodiments. For example, in some embodiments this alternate implementation of the laterally moving key guide is used where the touchsurface is a touchpad. In that situation, the user may press down on the touchpad to select an on-screen button, icon, section action, or any other action associated with the press of a pointing device button. In response to the press, the touchpad translates substantially vertically and pushes a touchpad guide with the ramps, analogous to the laterally-moving key guide with ramps discussed earlier, so that the guide slides in a lateral direction. When sufficient press force is removed, the ready/return mechanism based on similar principles to those disclosed herein may be used to urge the guide back into its original position and pushes the touchpad back to its ready position.

Exemplary Ramp Profiles

FIG. 11 shows various examples of ramp profiles 1110, 1120, 1130, 1140, 1150 that may be employed in various implementations using ramps. In at least some implementations, the ramp profile is the depression path of the touchsurface.

A ramp profile is the outline or contour of a cross section of the active surface of the ramps and/or chamfers used for the leveling/planar-translation-effecting mechanisms. In practice, the ramp profile informs or describes the motion of a touchsurface during its travel in response to a press and release, including any planar translation of the touchsurface (if the system is configured such that the touchsurface moves laterally in response to a press, or planar translation of a touchsurface guide if the system is configured such that the guide moves laterally in response to a press).

Each ramp profile 1110, 1120, 1130, 1140, 1150 actually shows two different profile options. For example, profile 1120 shows a first option to the left of the curve, and a second option to the right of the curve. Also, in some embodiments, different profiles that do not perfectly mesh are used for ramps for a guide and chamfers for a touchsurface. However, for ease of explanation here, the profile to the left of the curve is the one used on a ramp associated with a guide, the profile on the right is the one used on a chamfer associated with a touchsurface. Also, the discussion below presents comparisons between the profiles if they were of the same size. Thus, FIG. 11 shows a first exemplary ramp profile 1110 with a single-angle acute slope, a second exemplary ramp profile 1120 with a roll-off slope, a third exemplary ramp profile 1130 with a stepped slope, a fourth exemplary ramp profile 1140 with a scooped slope, and a fifty exemplary ramp profile 1150 with a radius slope, and has the shape of an arc of a circle.

The first exemplary ramp profile 1110 offers even and steady planar motion throughout the downward travel of the touchsurface. An angle 1112 between a base and the inclined surface of the ramp may be set at any appropriate value, including a value between thirty-five and sixty-five degrees, such as forty-five degrees. The shallower that the angle 1112 is set, the more planar translation occurs for a given amount of vertical travel. In some embodiments, if the angle 1112 is too shallow, it may be difficult for a user to move the touchsurface effectively when pressing down on it. Conversely, in some embodiments, if the angle 1112 is too steep, the leveling of the key may be compromised.

The second exemplary ramp profile 1120 provides more of a snap or breakaway feel at the rollover portion of the ramp than would generally be felt with the first exemplary ramp profile 1110.

The feel of a ramp with the third exemplary ramp profile 1130 is similar to the feel of the second exemplary ramp profile 1120, but the snap or breakaway feel is generally more dramatic.

As compared to the feel of a ramp with the first exemplary ramp profile 1110, the feel of a ramp using the fourth exemplary ramp profile 1140 is softer and, perhaps described by some as "spongy."

The feel of a ramp using the fifth exemplary ramp 1150 is similar to that of the stepped profile 1130 but with a smoother transition. That is, there is less snap to the feel.

The profiles depicted in FIG. 11 are informative of the behavior and/or feel of the planar-translational responsiveness of a touchsurface using such profiles. Of course, there are a multitude of alternative variations and combinations of the profiles depicted. In addition, many alternative profiles differ significantly from the ones depicted. In some embodiments, a single keyboard may employ a plurality of different ramp profiles in order to provide different tactile responses for different keys.

Exemplary Keyboard

FIGS. 12A-12C offer three different views of an exemplary keyboard 1200 that is configured to implement the techniques described herein. FIG. 12A is an isometric view of the exemplary keyboard 1200. FIG. 12B is top plan view of the exemplary keyboard 1200. FIG. 12C is a side elevation view of the exemplary keyboard 1200. As depicted, the exemplary keyboard 1200 has a housing 1202 and an array of keys 1204.

The exemplary keyboard 1200 is exceptionally thin (i.e., low-profile) in contrast with a keyboard having conventional full-travel keys. A conventional keyboard is typically 12-30 mm thick (measured from the bottom of the keyboard housing to the top of the keycaps). The exemplary keyboard 1200 has a thickness 1206 that is less than that, such as 4.0 mm thick (measured from the bottom of the keyboard housing to the top of the keycaps). With other implementations, the keyboard may be less than 4.0 mm, such as 3.0 mm, 2.5 mm, or 2.0 mm.

The exemplary keyboard 1200 may employ a conventional keyswitch matrix, based on membrane switch technology. The key switch matrix may be located under the keys 1204 and arranged to signal a keypress when the users presses associated keys down firmly. Alternatively, the exemplary keyboard 1200 may employ other keypress detection technology.

The exemplary keyboard 1200 is a peripheral keyboard, and is not an integrated pointing device. Alternative implementations may be integrated within the housing or chassis of a mobile phone, laptop computer, or any other device.

A keyboard employing the techniques described herein may or may not have its keys placed in a contaminate-collecting depression like the keyboard trough found in many keyboards. As shown by the exemplary keyboard 1200 in FIG. 12, the keys 1204 are not located in a depression or trough.

The exemplary keyboard 1200 may be integrated with a handheld or laptop computing device with a mechanism that drops the keys 1204 into their respective keyholes when the lid of the laptop is closed. Such dropping mechanism may include a tether that pulls each key from its ready position into its keyhole. Alternatively, such a mechanism may involve shifting or moving of the podium magnets of each key so that such podium magnet no longer retains the key in the ready position. Consequently, each key will drop into their respective keyholes.

Various embodiments enable this drop capability utilize designs that produces little or no undue mechanical wear and tear on the keys or other components. For example, magnets of the keys 1204 may be used to provide the returning force to the ready position, much as in response to the release of a user-applied pressing force. Thus, when the screen/lid is lifted, the keys 1204 snap up into their ready position in response to the tension of the tether being released and/or the podium magnet is restored to its original position. Various embodiments may augment a non-contact mechanism such as magnets with other mechanisms, or use other mechanisms.

Other Exemplary Key Assemblies

Figure 13:
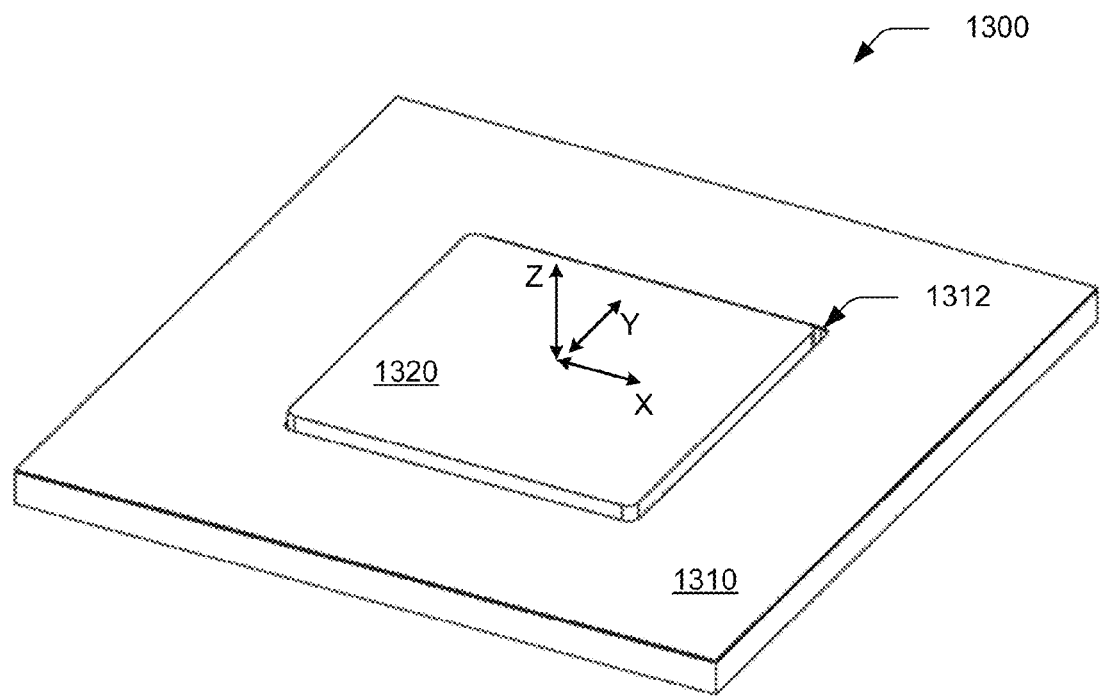
FIG. 13 is an isometric view of a third implementation configured in accordance with the techniques described herein.

FIG. 13 is an isometric view of still another exemplary key assembly 1300 configured to implement the techniques described herein to provide a satisfying tactile user experience using passive tactile response. The key assembly 1300 includes a key podium 1310 and a key 1320. Notice that the key 1320 sits above the podium 1300. Indeed, the key 1320 is suspended over (and/or partially in) a key-shaped hole 1312 ("keyhole") in the podium 1310.

In an embodiment of the FIG. 13 example, the key assembly 1300 is about 2.5 mm thick from top to bottom. The key podium 1310 is about 1.5 mm thick and the key 1320 is about 0.75 mm thick. The key 1320 is about 19 mm by 19 mm and the keyhole is slightly larger at 19 mm by 20 mm. Of course, the dimensions may differ with other implementations.

Figure 14:
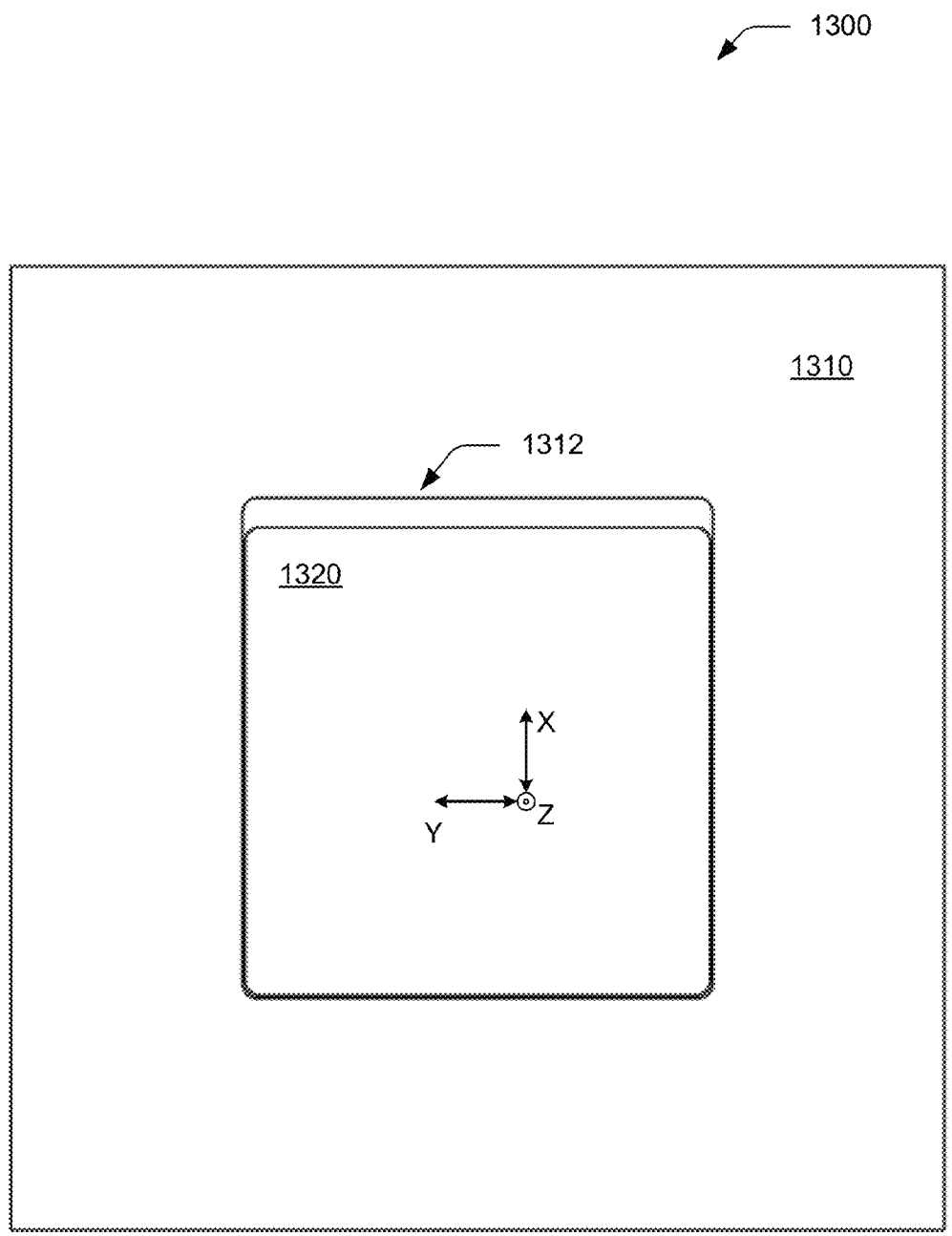
FIG. 14 is top plan view that illustrates the third implementation.

FIG. 14 is a top plan view of the key assembly 1300 with its podium 1310 and key 1320. As seen from above, the key-shaped hole 1312 fits the key snugly except for one side where a gap exists (about 1.0 mm in some embodiments). This gap in the keyhole 1312 allows the key 1310 room for its lateral travel.

Figure 15:
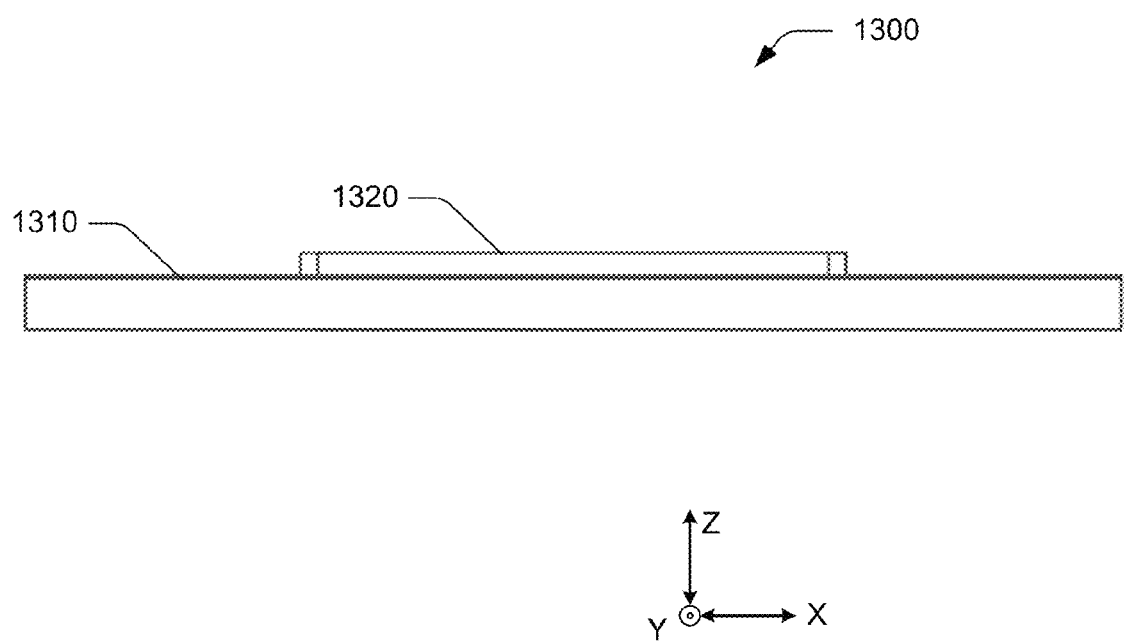
FIG. 15 is a side elevation view that illustrates the third implementation.

FIG. 15 is a side elevation view of the key assembly 1300 with its podium 1310 and key 1320.

Figure 16:
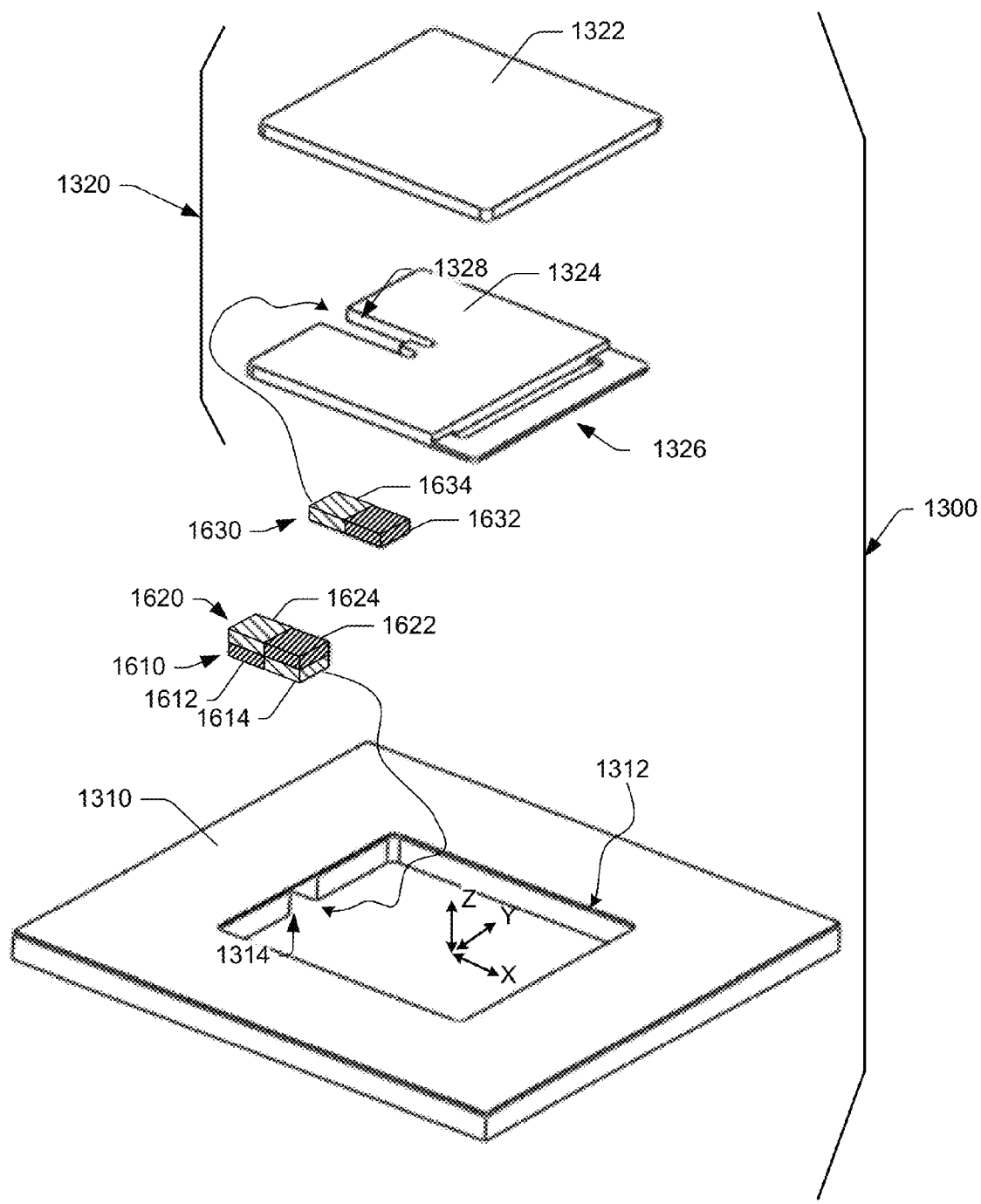
FIG. 16 is an exploded isometric view that illustrates the third implementation.

FIG. 16 is an exploded view of the key assembly 1300 with its podium 1310 and key 1320.

Figure 17:
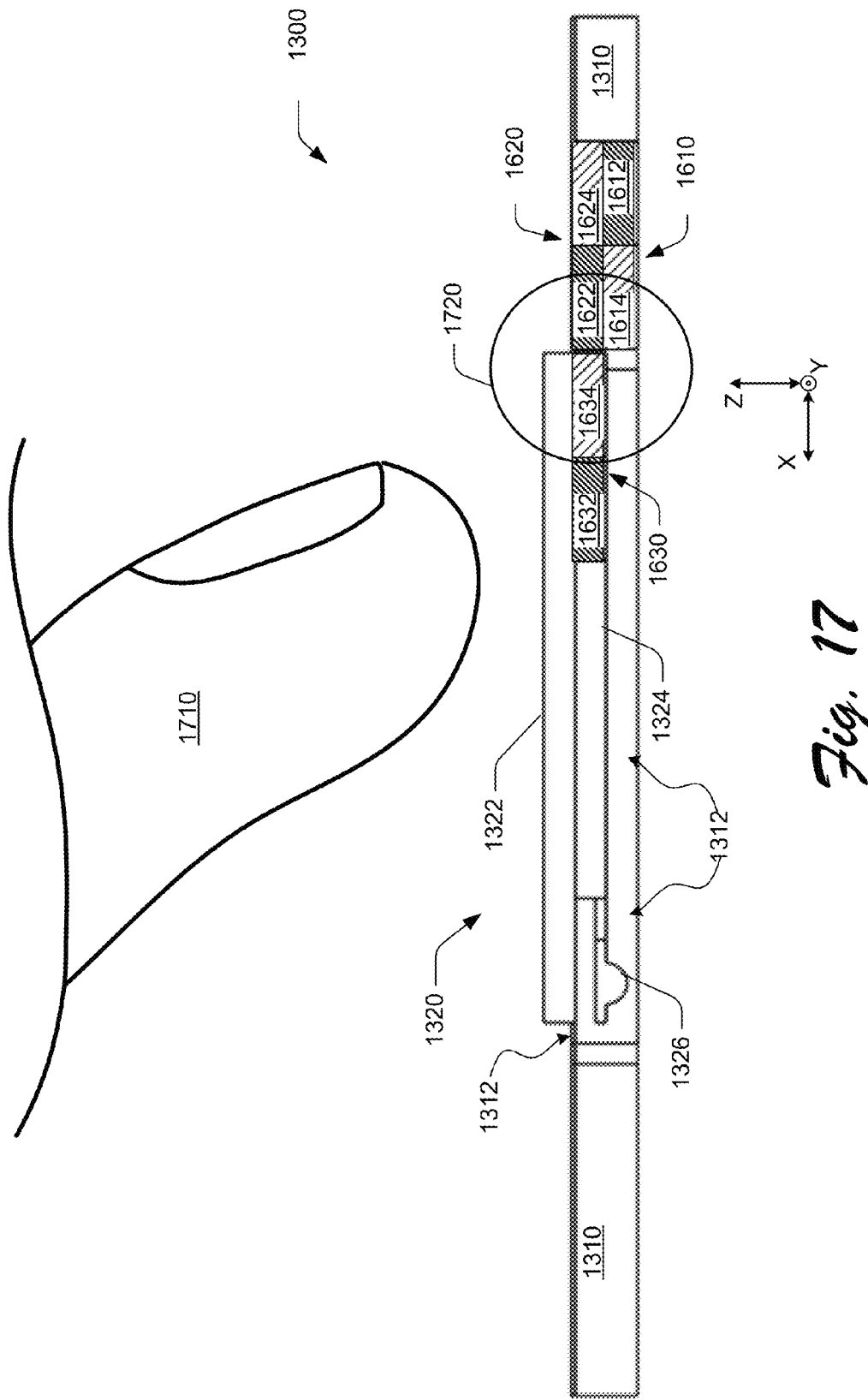
FIG. 17 is a cross-sectional view that illustrates the third implementation.

FIG. 17 is a cross-section of the key assembly 1300, with the cross-section being taken at the center of the key assembly 1300. For context, a user's finger 1710 is shown hovering over the key 1320 in anticipation of pressing down on the key.

The views of FIGS. 16 and 17 show three magnets (1610, 1620, 1630) which were not exposed in the previous views of the assembly 1300. Magnets 1610 and 1620 are stacked together and disposed (such as by a press fit) into a form-fitting recess 1314 of the key podium 1310. As depicted in both FIGS. 16 and 17, the magnet 1620 is stacked atop the magnet 1610 with the poles of one magnet (1622, 1624) directly over the opposite poles (1612, 1614). This arrangement locates the opposite poles of magnets to provide attractive forces.

The podium magnets are mounted into the podium 1310. One pole (e.g., 1622) of the upper magnet 1620 and an opposite pole (e.g., 1614) of the lower magnet 1610 of the magnet stack are magnetically exposed to the interior of the keyhole 1312.

Analogous to the discussion presented for the key assembly 300, the two magnets 1610 and 1620 may be collectively called the "podium magnet arrangement," and there may be any number of magnets in the podium magnet arrangement (including fewer or more than the two shown in FIG. 16), arranged in any appropriate way to provide appropriate magnetic forces.

As depicted in both FIGS. 16 and 17, the key 1320 includes a keycap 1322 and key base 1324. The key base 1324 includes a key leveler 1326. In some implementations, the key leveler 1326 may be a biased component, configured to provide motion and reaction forces along particular axes. The key leveler 1326 keeps the key relatively level during its negative Z-direction travel. Other leveling mechanisms and approaches may be employed in combination or in alternative implementations. In one example alternative, magnets may be distributed around the periphery of the keyhole 1312 to hold the key 1320 and to facilitate an even breakaway in response to a downward force. Other leveling approaches are discussed later in this application.

A key magnet 1630 is snugly mounted/inserted into a form-fitting recess 1328 of the key base 1324. The recess 1328 is shown in FIG. 16. This key magnet 1630 has two poles (1632, 1634). One pole (1634) is magnetically exposed to the interior walls of the keyhole 1312.

For the purpose of the planar-translation-responsiveness-to-vertical-travel technology described herein, the pole 1634 of the exposed end of the key magnet 1630 is the opposite of the pole 1622 of the exposed end of the top magnet 1620 of the podium magnet arrangement. The magnet 1630 of the key 1320 is attracted towards magnet 1620 of the podium 1310. Consequently, the magnetic attractive forces hold the key 1320 tightly against the podium 1310 and in a cantilevered fashion over and/or partially in the keyhole 1312. This cantilevered arrangement is depicted in FIG. 17.

Collectively, the key-magnet arrangement and the podium-magnet arrangement of the key assembly 1300 forms a ready/return mechanism that simulates a snap-over feel, similar to that of the second implementation.

Figure 18A:
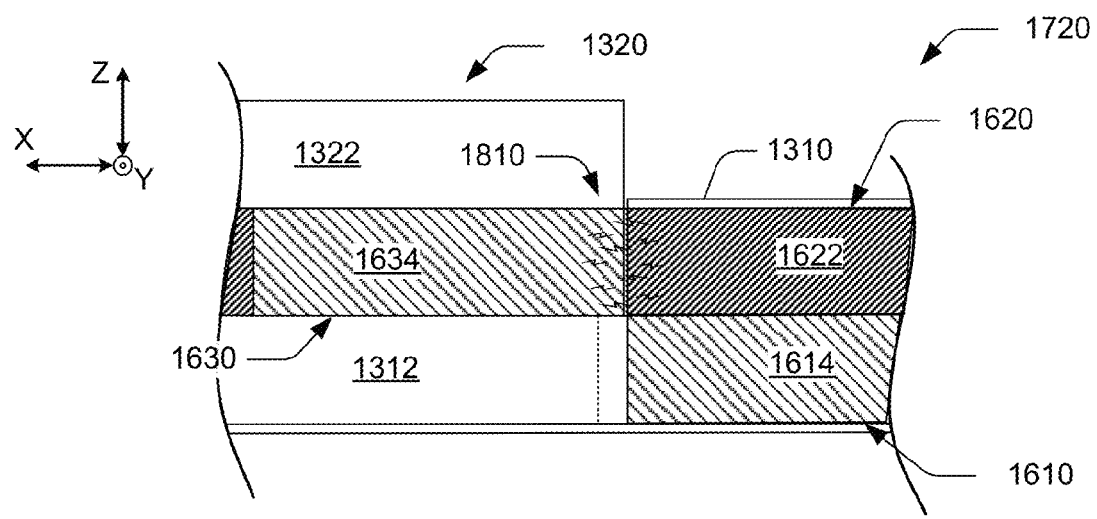
FIGS. 18A and 18B show a cut-away portion of the third implementation as circled in FIG. 17.
Figure 18B:
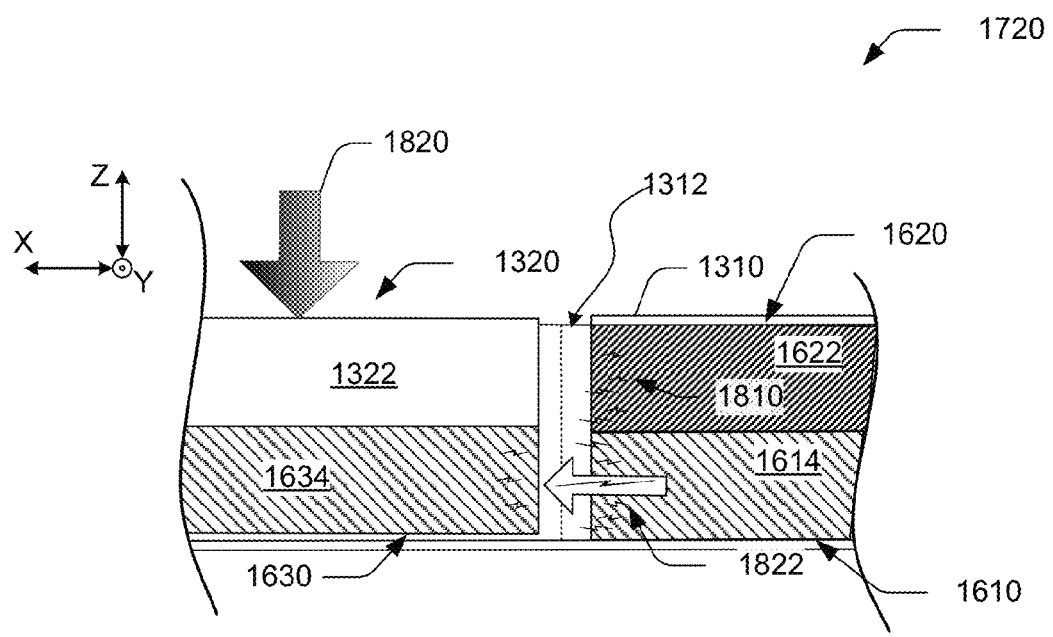

FIGS. 18A and 18B show a cut-away portion 1720 as circled in FIG. 17. FIG. 18A shows the components of the key assembly 1300 as they are arranged in FIG. 17. The key 1320 is operatively associated via magnetic attraction to the key podium 1310. An attraction 1810 between the opposite poles (1634, 1622) of the key magnet 1630 and the top podium magnet 1620 is indicated by a collection of bolt symbols ($\nwarrow$) therebetween.

FIG. 18B shows the same components of the assembly 1300 but after a downward force (represented by a vector 1820) imparted on the key 1320 by a user's finger has moved the key 1320 downwards in the negative Z-direction. The downward force breaks the attraction 1810 between the key magnet 1630 and the top podium magnet 1620.

As the key 1320 travels downward, it is also pushed laterally by a magnetic repulsive force between the like poles (1634, 1614) of the key magnet 1630 and lower podium magnet 1610. The repulsion 1822 between the magnets is represented in FIG. 18*b* by an arrow and a collection of bolt symbols ($\nwarrow$).

With this arrangement, the user's experience of a keypress can be made similar to the feel of a snap-over. The key assembly 1300 can be configured to simulate the feel of a breakover point of a rubber dome, and the release of the key 1320 from the magnetic hold can be made to feel similar to the collapsing of a rubber-dome.

The sidewalls of the keyhole 1312 act as guide to the key 1320 during the key's negative Z-direction travel. The gap between the key 1320 and the key podium 1310, which is located away from the wall with the podium magnets 1610, 1620 mounted therein, allows the key 1320 to travel laterally during its downward travel of a keypress. The key leveler 1326 may touch or hit the wall at the bottom of the press. Alternatively, another key guide system may be used, such as the key guide system similar to that described for key assembly 300 can be used to aid in key leveling and lateral displacement.

Figure 19:
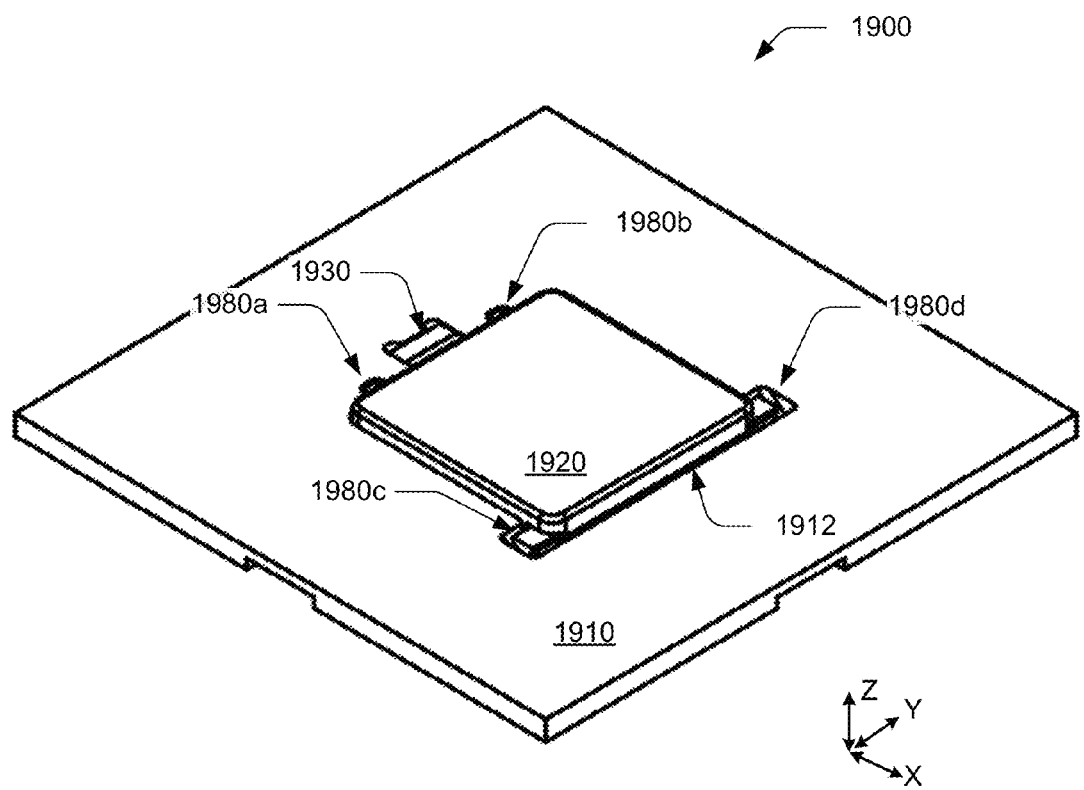
FIG. 19 is an isometric view of a fourth implementation configured in accordance with the techniques described herein. The fourth implementation is an exemplary key assembly.

FIG. 19 is an isometric view of still another exemplary key assembly 1900 configured to implement the techniques described herein to provide a satisfying tactile user experience using passive tactile response. The key assembly 1900 includes a key podium 1910 and a key 1920. The key 1920 is suspended over (and/or partially in) a key-shaped hole 1912 ("keyhole") in the key podium 1910.

Figure 20:
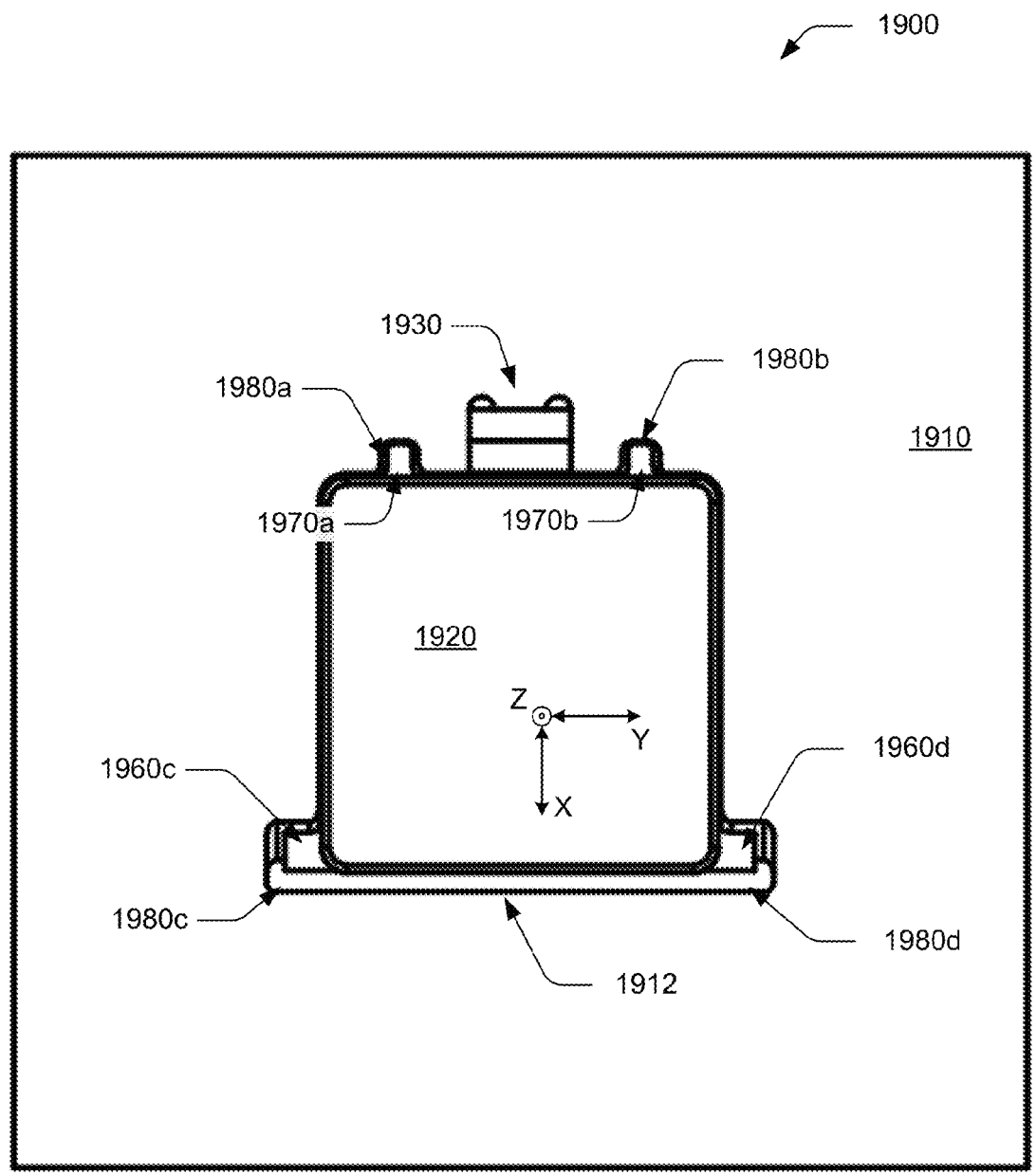
FIG. 20 is top plan view that illustrates the fourth implementation.

FIG. 20 is a top plan view of the exemplary key assembly 1900, with the same key podium 1910 and key 1920.

Figure 21:
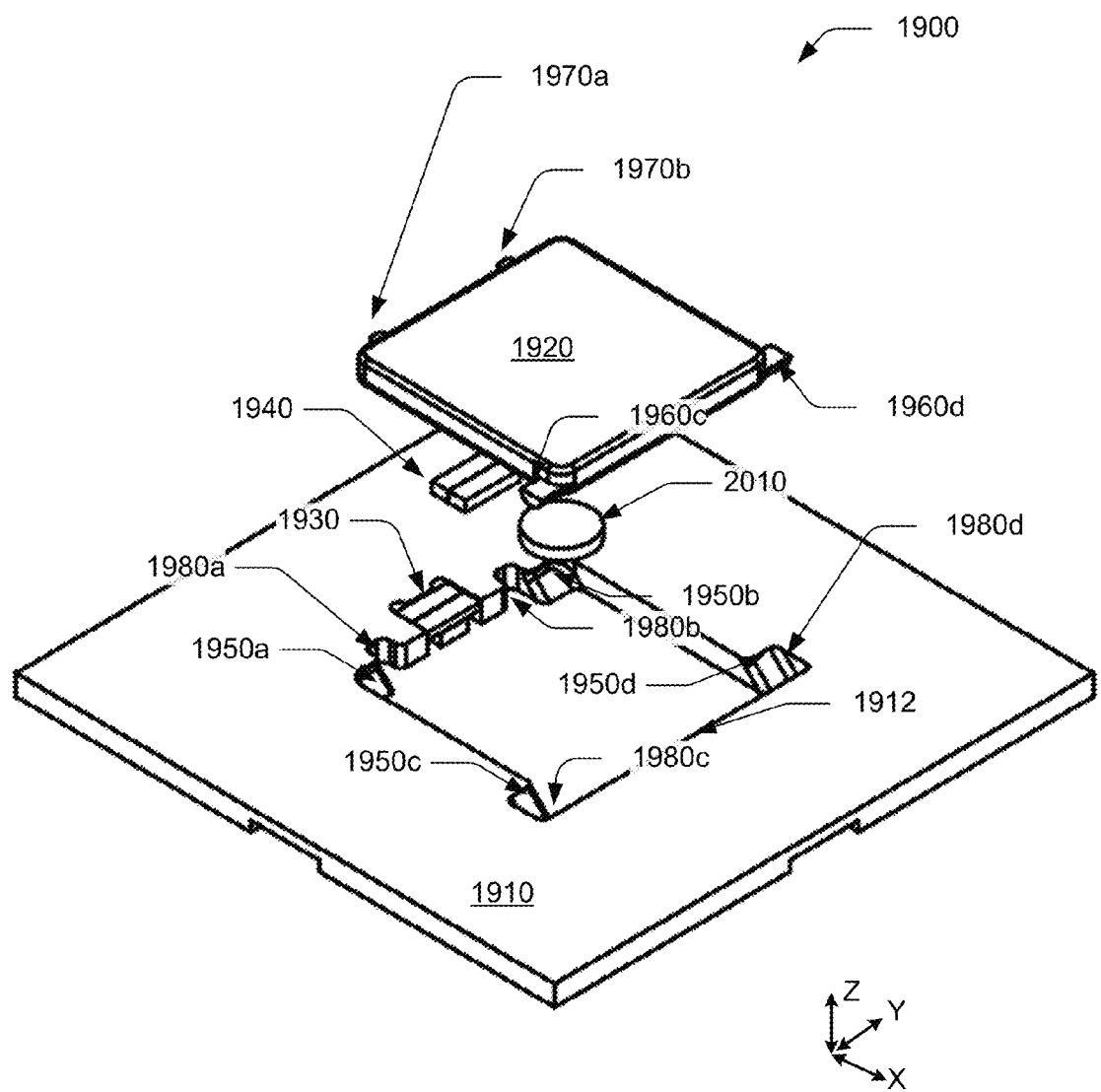
FIG. 21 is an exploded isometric view that illustrates the fourth implementation.

FIG. 21 is an exploded view of the exemplary key assembly 1900, with the same key podium 1910 and key 1920. Also, shown in FIG. 21 is a key hassock 2010.

As shown in FIGS. 19-21, this key assembly 1900 differs from the key assembly 1300 (shown in FIGS. 13-18) in the arrangements of the magnets and in the key and podium configuration that designed to impart lateral force onto the key and to provide leveling to the key.

In the key assembly 1900, the podium magnet arrangement includes one single magnet 1930. The single, non-stacked magnet arrangement can be seen in FIG. 21. This sole magnet is disposed horizontally and only one pole is magnetically exposed into the keyhole 1912. The magnetically exposed pole of magnet 1930 is opposite of the exposed pole of the key magnet 1940.

As seen in FIG. 21, the podium 1910 has ramps 1950*a*, 1950*b*, 1950*c*, 1950*d* built proximate each corner region of the keyhole 1912. Inverse and complementary chamfers are built into the key 1920. Two such complementary chamfers (1960*c* and 1960*d*) are shown in FIGS. 20 and 21. In one or more implementations, the ramps 1950*a*, 1950*b*, 1950*c*, 1950*d* and the complementary chamfers are composed of acetal resin (e.g., DuPont™ brand Delrin®). The dynamic coefficient of friction (μ) for two acetal resin surfaces is around 0.2 in many embodiments.

Working in cooperation, the key 1920's chamfers (1960*c-d*, and two more chamfers not shown) slide down the podium 1910's ramps 1950*a-d* during a downward keypress. Regardless of where on the key 1920 that a user presses, the ramp-pairings in each corner keep the key 1920 steady and level during a keypress.

In addition, the ramp-pairings effectively translate at least some of the user's downward force into lateral force. Thus, the ramp-pairings convert the negative Z-direction movement of the key 1920 into both negative Z-direction and lateral direction movement. Unlike key assembly 1300, there is no lower podium magnet used in the key assembly 1900. However, alternative implementations may employ a lower podium magnet to aid the ramps with the planar-translation effecting action.

In addition, the key 1920 comprises four flanges or protuberances, two of which are labeled 1970*a* and 1970*b*. The other two protuberances are combined with chamfers 1960*c* and 1960*d*, such that features 1960*c* and 1960*d* provide both ramp and protuberance functions.

As seen in FIGS. 19, 20, and 21, the podium 1910 has four protuberance-receiving recesses 1980*a*, 1980*b*, 1980*c*, and 1980*d* formed in parts of the walls of the keyhole 1912. Each of these recesses 1980*a*, 1980*b*, 1980*c*, and 1980*d* is configured to receive a corresponding one of the key's protuberances 1970*a-b*, 1960*c-d*. FIGS. 19-21 show the magnetically coupled key 1920 with its protuberances 1970*a-b*, 1960*c-d* fitted into their corresponding recesses 1980*a-d*.

In this arrangement, a finishing layer (not shown) may be extended over parts of the podium 1910 and over the recesses so as to retain the protuberances 1970*a-b*, 1960*c-d* underneath. In this way, a finishing layer would retain the key 1920 in its position suspended over and/or within the keyhole 1912. The finishing layer may be made of any suitable material that is sufficiently strong and sturdy. Such material may include (but is not limited to) metal foil, rubber, silicon, elastomeric, plastic, vinyl, and the like.

The key hassock 2010 of the fourth implementation is analogous to the key hassock 640 of the second implementation.

Magnets

Where used, the magnets for many embodiments are permanent magnets and, in particular, commercial permanent magnets. The most common types of such magnets include, in order of strongest magnetic strength to the weakest are: Neodymium Iron Boron; Samarium Cobalt; Alnico; and Ceramic.

Because of their relatively small size and impressive magnetic strength, some embodiments in accordance with the techniques described herein utilize Rare Earth Magnets, such as neodymium-based magnets. Rare Earth Magnets are strong permanent magnets made from alloys of rare earth elements.

Alternative implementations may employ non-rare earth permanent magnets or electromagnets.

Exemplary Computing System and Environment

The below describes an example of a suitable environment within which one or more implementations, as described herein, may be implemented. The exemplary computing environment is only one example environment, and is not intended to suggest any limitation as to the scope of use or functionality of the implementations.

The various implementations, as described herein, may comprise processing systems communicatively coupled to sensor electrodes configured to sense press states of touch-surfaces. The processing systems are configured to operate the sensor electrodes, and to process sensor signals to determine the press states. In some embodiments, the processing system is further configured to detect input to devices other than those with touchsurfaces embodying the techniques described herein.

The processing systems may comprise circuitry, processor-executable instructions, combinations thereof, and the like. For example, the processing system may comprise parts of or entireties of one or more integrated circuits. In some embodiments, the processing system may consist of an integrated circuit (IC) as well as processor-executable instructions stored in non-transitory media. These instructions may be program modules comprising routines, programs, objects, components, data structures, etc. that perform particular tasks or implement particular abstract data types.

A specific example operating environment is that of a laptop computer, which includes a keyboard with keys embodying the techniques described herein, a touchpad, and a display screen that may be a touch screen, and other components. In such a system, the processing system may comprise one or more ICs loaded with appropriate processor-executable instructions that direct the IC(s) to operate the keyboard sensors to detect presses of the keys, and to operate the touch pad to detect user input to the touchpad, and the display screen (or touch screen if it includes touch input functionality).

The IC(s) may direct the IC to detect and determine if a key has been pressed (or the extent of the press), and provide an indication of press status to a main CPU of the laptop. The IC(s) may also drive the touchpad (and touchscreen if applicable) to detect input to those devices. The IC(s) may also operate the display screens to display images. In some embodiments, the IC(s) are configured to update a displayed image in response to direction from the main CPU about changes to the image or what images to display. In some embodiments, the IC(s) are configured to update a displayed image in response to presses on keys or input to the touchpad (or touchscreen if applicable) without such direction from the main CPU.

Non-Tactile User Feedback

Implementations in accordance with the techniques described herein may be configured to provide feedback other than tactile feedback, such as visual and aural feedback. Any appropriate component, including those supporting touchsurfaces, ready/return mechanisms, key guides, key podiums, and leveling mechanisms, may also be configured to provide such feedback.

For example, visual feedback may be provided by the change in the position of a touchsurface in response to a press, with backlighting changes, with displayed images, etc. As another example, aural feedback may be provided by speakers or mechanically. In some embodiments, the materials, shapes, locations, inclusion of additional features (e.g. detents) of one or more of the following are configured for aural feedback: a component supporting a touchsurface, the ready/return mechanism, and the leveling/planar translation effecting mechanism. The configuration may be to provide a sound indicating breakaway, press to an intermediate level, press to the bottom of vertical travel, return to ready position, combination thereof, etc. As yet another example, Some embodiments for keys are configured to provide aural feedback similar to the clicking of conventional keys.

Additional and Alternative Implementation Notes

The implementations described herein are meant as examples, and many variations are possible. As one example, any appropriate feature described with one implementation may be incorporated with another. As a first specific example, the retention features of the key assembly 1900 may be incorporated in the key assembly 200. As a second specific example, any of the implementations described herein may or may not utilize a finishing layer. As a third specific example, the materials of any of the key assemblies 1300, 1900 may comprise the materials described for the key assembly 200. As a fourth specific example, ferrous material may be used to replace any of the magnets described herein, including parts of or entire podium magnet arrangements or key magnet arrangement.

In addition, the structure providing any function may comprise any number of appropriate components. For example, a same component may provide leveling, planar-translation-effecting, readying, and returning functions for a keypress. In some embodiments, bias-arms designs provide such functions. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions.

Further, it should be understood that the techniques described in the various implementations herein may be used in conjunction with each other, even where the function may seem redundant. For example, the bias arms ready/return or leveling mechanism may be used to replace or to augment the magnets 220, 222 or the leveling/planar translation effecting mechanisms 230 of the key assembly 200.

Also, while the implementations of the touchsurface described herein have primarily focused on a key of a keyboard, other implementations of leveled touchsurface with planar translational responsiveness to vertical travel are available. Similarly, while the implementations described herein have primarily focused on human fingers as the sources of input, other body parts or extensions of body parts (e.g. a pen) are contemplated.

For example, a touchsurface implementing the new techniques described herein may be any device with a human-machine interface (HMI) that a human touches. Examples of suitable HMI devices include (by way of illustration and not limitation) a surface of a touchscreen or touchpad, a surface of a key of a keyboard or key pad, a surface of a button, a surface associated with the clicking of a mouse, trackball, pointing stick, or other pointing device, a surface of a gamepad, paddle, foot mouse, steering wheel, jog dial, and the like.

Examples of computing systems that may employ a device constructed in accordance with the techniques described herein include (but are not limited to): phones, including mobile phones such as smartphones (e.g., the iPhone™), tablet computers (e.g., the iPad™), monitors, control panels, light switches or controls, vehicle dashboard panels, laptop or notebook computers, netbook computers, desktop computers, device accessories (such a tablet case with a build-in keyboard), peripheral keyboards, remote controls, gaming devices, electronic kiosks, automated teller machine (ATM)s, networked appliances, point-of-sale devices, medical workstation, and industrial workstations.

For instance, a touchscreen of a tablet computer or smartphone may be constructed in accordance with the techniques described herein. If so, the user may be able to select an on-screen icon or button by pressing on the touchscreen. In response, the touchscreen may translate downwards and laterally.

As another example, a laptop computer may comprise a touchpad constructed in accordance with the techniques described herein. Without having to press any other mechanical buttons, the user may select an on-screen icon or button by pressing down on the touchpad. In response, the touchpad surface may translate downward and laterally. Alternatively, the touchpad may just move downward substantially vertically without any substantive lateral motion of the touchpad surface. The switch actuation associated with the movement may result from the touchpad structure pushing a biased guide to slide in a lateral direction as it descends.

In some implementations, an exemplary touchsurface may be opaque. In other implementations, an exemplary touchsurface may be fully or partially translucent or transparent, such that visible light may pass through the touchsurface.

One or more of the implementations may employ force-sensing technology to detect how hard a user presses down on a touchsurface.

Examples of other touchsurface implementations and variations may include (by way of example and not limitation): a toggle key, slider key, slider potentiometer, rotary encoder or potentiometer, navigation/multi-position switch, and the like.

Toggle Key—A toggle key is a levered key that pivots at its base. A toggle key implementation may have mutually attractive magnets on both sides of a keyhole. With this construction, as a user moves the toggle away from one magnet, the key magnet creates a snap over feel and holds the toggle in the desired positions.

Slider Key—This is similar to the toggle key, except instead of pivoting, it slides.

Slide Potentiometer—This is similar to a slider key, except the travel is much longer. Magnets may be used to provide detents for the slider as it moves along the slider path. For example, magnets may be used at the ends and in the middle to define these points. Also, magnets of differing strengths may be used to provide different tactile responses.

Rotary encoder or potentiometer—Magnets could be used around the perimeter to provide detents. Implementations might use hard and soft detents enabled by different magnetic strengths.

Navigation/Multi-Position switch—This is a multi-direction switch. An implementation may use magnets in all directional quadrants and the switch would levitate between them.

Ready/Return Mechanisms

Ready/return mechanisms other than those already described herein can be utilized without departing from the spirit and scope of the claimed subject matter. For example, alternative return mechanisms might restore the touchsurface to its ready position using magnetic repulsion pushing the touchsurface back to the ready position. Other alternative return mechanisms might not use magnetic or electromagnetic forces. For example, biasing or spring forces may be used to push or pull the touchsurface to its ready position and keep the touchsurface in that position. Examples of alternative mechanisms include elastomeric domes such as those found in conventional keyboards. Other examples include (but are not limited to) springs, elastic bands, and other tactile domes (e.g., rubber dome, elastomeric dome, metal dome, and the like).

In addition, multiple mechanisms may be used to accomplish the return and ready functions separately. For example, one mechanism may retain the touchsurface in its ready position and a separate mechanism may return the touchsurface to its ready position.

Leveling/Planar-Translation-Effecting Mechanisms

Likewise, other types of leveling/planar-translation-effecting mechanisms can be utilized without departing from the spirit and scope of the claimed subject matter. For example, alternative leveling/planar-translation-effecting mechanisms might level a touchsurface without ramps and/or might impart a planar translation from a vertical movement without using ramps or magnetic or electromagnetic forces.

Examples of alternative leveling/planar-translation-effecting mechanisms include (but are not limited to) a biased-arms mechanism, a four-bar linkage mechanism, a double-barrel eccentric cam mechanism, an eccentric tilting cam-plates mechanism, a tilting plate with captured sliding peg mechanism, and a rib-and-groove mechanism.

Some of these examples are expanded upon below, and many features have been simplified and components excluded in those discussions for clarity of explanation.

Bias-arms mechanism I—With a bias-arms mechanism, one or more resilient arms support the touchsurface from underneath. The arms act as leveling mechanism, planar-translation-effecting mechanism, and return/ready mechanism. The arms bias or are "spring-loaded" when they bend in response to the downward force on the touchsurface. The bent arms act much like the ramps of implementations of the planar-translation-effecting mechanisms described herein. When released, the biasing of bent arms act much like the magnets of implementations of the return/ready mechanisms described herein. Generally, the biasing or resilient nature of the arms keep the arms leveled in much the same way as the leveling mechanisms described herein. In some embodiments, the bias arms comprise cantilevered arms configured to support keys. In response to a keypress, the cantilevered arms bend and push back against the press force. Once the press force is removed, the cantilevered arms urge the key back into the ready position.

With a double-barrel eccentric cam mechanism, the touchsurface is supported thereunder by at least two rotating bars or "barrels" with eccentric cams at the end of each barrel. For each eccentric cam, a cam-pin would extend from the edge of the touchsurface and fit into the eccentric cam end of a barrel. Both the eccentric cam and its corresponding cam-pin would fit into a space in the periphery of the podium that is fitted to receive the cam and cam-pin. The double-barrel eccentric cam mechanism is similar to a four bar linkage with short bars, where the side linkages coupling the key to the key podium have been reduced to cams.

With an eccentric tilting cam-plates mechanism, the touchsurface is supported thereunder by at least two plate-like cams ("cam-plates") that each rest on their own eccentric tilting plates. Under a downward force, the tilting plates tilt or teeter-totter so as to allow the downward movement of the touchsurface. During the downward movement, each of the cam-plates slide and ride within a fitted recess in their associated tilting plates. In doing so, the touchsurface remains level while moving up and down.

With a tilting plate with captured sliding peg mechanism, the touchsurface is supported thereunder by at least one eccentric tilting plate that is arranged and fitted into the space below the touchsurface so as to tilt or teeter-totter to allow the downward movement of the touchsurface. One or more pegs extend from the edge of the touchsurface and is captured by a diagonal slot in the periphery of the podium. During the downward/upward movement of the touchsurface, the captured peg slides in the slot in a manner to keep the touchsurface level while the tilting plate tilts.

With a rib-and-groove mechanism, the touchsurface have ribs that would ride along a sloped path of grooves of the podium. The confined path of a groove would include a component of negative Z-direction travel and a planar direction travel. Of course, the touchsurface may have the grooves and the podium have the ribs.

In addition, multiple mechanisms may be used to accomplish one or more of the leveling, planar-translation-effecting, and ready/return functions. For example, one mechanism may level the touchsurface and a separate mechanism may impart the planar translation to the touchsurface.

FEATURES, ASPECTS, FUNCTIONS, ETC. OF IMPLEMENTATIONS

In the above description of exemplary implementations, for purposes of explanation, specific numbers, materials configurations, and other details are set forth in order to better explain the invention, as claimed. However, it will be apparent to one skilled in the art that the claimed invention may be practiced using different details than the exemplary ones described herein. In other instances, well-known features are omitted or simplified to clarify the description of the exemplary implementations.

The inventors intend the described exemplary implementations to be primarily examples. The inventors do not intend these exemplary implementations to limit the scope of the appended claims. Rather, the inventors have contemplated that the claimed invention might also be embodied and implemented in other ways, in conjunction with other present or future technologies.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." In addition, the articles "a" and "an" as used in this application and the appended claims should generally be construed to mean "one or more," unless specified otherwise or clear from context to be directed to a singular form.

The following enumerated paragraphs represent illustrative, non-exclusive descriptions of methods, systems, devices, etc. according to the techniques described herein:

A. A touchsurface (e.g., key) having a lateral translation imparted upon it during a human-imparted Z-direction force on that key (especially when such lateral travel is not caused by a motor of any kind).
  A1. The touchsurface of paragraph A, wherein magnetic repulsion and/or attraction imparts the lateral travel.
  A2. The touchsurface of paragraph A, wherein multiple ramps impart the lateral travel in response to a downward force.
  A3. The touchsurface of paragraph A, wherein the touchsurface is part of a rigid body.
B. A cantilevered retention of a rigid key (especially when hold is by magnetic attraction) in its ready position.
C. Holding a rigid key laterally (e.g., interior of keyhole 1312 holding (e.g., via magnetic attraction) the key thereto) in its ready position.
D. Magnetic repulsion or attraction to impart a lateral travel to a key during Z-direction travel (which is the up/down movement of key in response to a keypress and key release).
E. Magnetic attraction to return the key to its original position—that attraction may impart both a lateral and Z-direction movement of the key.
F. Stacking and alternating pole arrangement of two of more podium magnets.
G. Arrangement of the key-receiving cavity (e.g., keyhole 1312) and shape of key to fit together for the purpose of allowing lateral translation of the key during a keypress.
H. Backlighting arrangement—lighting element under a transparent or translucent key.
I. Alternative magnet arrangement for a stack of multiple (3+) magnets with alternating poles (to impart multilateral movement (e.g., back and forth in X or Y direction) of key during Z-direction travel).
J. Such alternative magnet arrangement may include an array of magnets dispersed about a key-receiving cavity (e.g., keyhole 1312) to impart a multi-vectored lateral translation (e.g., in both X and Y directions) of the key during Z-direction travel.
K. Multiple ramp-pairings between the podium and the key to perform both leveling and Z-direction to lateral direction force transference on the key.
L. An apparatus comprising at least one touchsurface configured to provide a satisfying tactile keypress experience for a user via planar translation responsiveness to a vertical travel of the touchsurface.
M. An apparatus comprising at least one touchsurface configured to provide a satisfying tactile keypress experience for a user without a haptic motor.
N. An apparatus comprising at least one touchsurface configured to provide a satisfying tactile keypress experience for a user without an active actuator.
O. An apparatus comprising at least one touchsurface configured to translate in a multi-vectored manner in response to a single-vector force imparted by a user's contact with the surface.
P. An apparatus of paragraphs L-O, wherein the touchsurface is a key or a touchscreen.
Q. An apparatus of paragraphs L-O, wherein the touchsurface is transparent or translucent.
R. A human-machine (e.g., computer) interaction (HMI) device comprising:
  a podium defining a hole therein, wherein one or more podium magnets are mounted to the podium so as to magnetically expose at least one pole of the one or more podium magnets to the interior of the hole;
  a touchsurface shaped to fit into the hole and suspended over and/or within the hole, wherein one or more touchsurface magnets are mounted to the touchsurface so as to magnetically expose at least one pole of the one or more touchsurface magnets, the exposed pole of the one or more touchsurface magnets being opposite of the exposed pole of the one or more podium magnets,
  wherein a magnetic coupling between the exposed pole of the one or more touchsurface magnets and the exposed pole of the one or more podium magnets suspends the touchsurface over and/or into the hole of the podium.
S. A HMI device as recited in paragraph R, wherein the touchsurface is a key or a touchscreen.
T. A HMI device as recited in paragraph R, wherein the touchsurface is transparent or translucent.
U. A HMI device as recited in paragraph R, wherein the touchsurface is suspended in a cantilevered fashion over and/or in the hole of the podium.
V. A HMI device as recited in paragraph R, wherein the magnetic coupling between the exposed pole of the one or more touchsurface magnets and the exposed pole of the one or more podium magnets is configured to release when a downward force of a typical keypress is applied to the touchsurface.
W. A HMI device as recited in paragraph V, wherein the magnetic coupling between the exposed pole of the one or more touchsurface magnets and the upper pole of the one or more podium magnets is restored after the downward force of the keypress is released.
X. A HMI device as recited in paragraph W, wherein the restoration of the magnetic coupling moves the touchsurface, both up and laterally, back to its original suspended position.
Y. A HMI device as recited in paragraph R, wherein the podium and/or touchsurface includes one or more structures configured to redirect at least some of a downward force applied to the touchsurface to move the key laterally during its downward travel.
Z. A HMI device as recited in paragraph R, wherein the podium magnets include at least two magnets arranged in a stacked manner so that an upper magnet has the exposed pole coupled to the exposed pole of the touchsurface's magnet and the lower magnet has its own exposed pole, which is opposite on polarity to that of the upper magnet's exposed pole.
AA. A HMI device as recited in paragraph Z, wherein a magnetic repulsion between the like poles of the exposed pole of the one or more touchsurface magnets and the lower pole of the one or more podium magnets pushes the touchsurface laterally during the touchsurface downward movement into the hole in the podium.
BB. A HMI device comprising a cantilevered key suspended over a cavity configured to receive the key when a downward force is applied to the key.
CC. A HMI device comprising a magnetically coupled cantilevered touchsurface suspended over a cavity configured to receive the touchsurface when a downward force is applied to the touchsurface.

DD. A HMI device as recited in paragraph CC, wherein the touchsurface is a key and/or a touchscreen.

EE. A HMI device as recited in paragraph CC, wherein the device is further configured to magnetically repel the freed touchsurface in the cavity after a downward force moves the touchsurface into the cavity.

FF. A HMI device comprising a touchsurface suspended over a cavity configured to receive the touchsurface, wherein a sidewall of the touchsurface is magnetically coupled to an interior wall of the cavity.

GG. A human-machine (e.g., computer) interaction (HMI) device comprising:
- a podium with a cavity defined therein;
- a touchsurface suspended over the cavity, the touchsurface being configured to fit into the cavity when a downward force is applied to the touchsurface to move the touchsurface into the cavity;
- two or more magnets operatively connected to each of the podium and the touchsurface, the magnets being arranged to impart a lateral movement on the touchsurface when the downward force is applied to the touchsurface to move the touchsurface into the cavity.

HH. A HMI device as recited in paragraph GG, wherein the lateral movement is imparted by a magnetic repulsion between two or more magnets.

II. A HMI device as recited in paragraph GG, wherein the lateral movement is imparted by a magnetic attraction between two or more magnets.

JJ. A HMI device as recited in paragraph GG, wherein the lateral movement includes movement in more than one lateral direction.

KK. A method of passive-translational responsiveness comprising:
- receiving a force in a downward direction upon a magnetically coupled touchsurface that is suspended over and/or in a cavity configured to receive the touchsurface when a downward force is applied to the touchsurface;
- in response to the receiving of the downward force, releasing the magnet coupling suspending the touchsurface;
- imparting a lateral translation upon the touchsurface as it descends into the cavity.

LL. A method of passive-translational responsiveness as recited in paragraph KK, further comprising, in response to a release of sufficient force, returning the touchsurface to its original suspended position over and/or in the cavity.

MM. A method of passive-translational responsiveness as recited in paragraph KK, further comprising constraining the touchsurface from rotation in response to the receiving of the downward force.

NN. A key assembly comprising:
- a key presented to a user to be depressed by the user;
- a leveling mechanism operatively associated with the key, the leveling mechanism being configured to constrain the key to prevent rotation thereof;
- a diagonal-movement-imparting mechanism operatively associated with the key, the diagonal-movement-imparting mechanism being configured to impart a diagonal movement to the key while the key travels vertically in response to a user's downward press and/or removal of sufficient force to keep the key depressed.

OO. A touchpad assembly comprising:
- a touchpad presented to a user to be depressed by the user;
- a leveling mechanism operatively associated with the touchpad, the leveling mechanism being configured to constrain the touchpad to prevent rotation thereof;
- a biased guide mechanism operatively associated with the touchpad, the biased guide mechanism being configured to be slid laterally in response to being pushed by the touchpad during its substantially vertical downward travel and the biased guide mechanism being further configured to urge the touchpad back up to its original position.

PP. A laptop computer comprising:
- a hinged lid/screen;
- a keyboard with magnetically suspended keys with each key having its own keyhole thereunder for receiving the key, the keyboard being opposite there of the hinged lid/screen;
- a key-retraction system configured to retract the magnetically suspended keys into their respective keyholes, wherein the key-retraction system retracts the keys in response an indication of lid/screen closure.

QQ. A keyboard comprising:
- a keyboard chassis;
- multiple key assemblies supported by the keyboard chassis, wherein each key assembly comprises:
  - a key presented to a user to be depressed by the user;
  - a leveling mechanism operatively associated with the key, the leveling mechanism being configured to constrain the key to a level orientation while the key is depressed by the user;
  - a planar-translation-effecting mechanism operatively associated with the key, the planar-translation-effecting mechanism being configured to impart a planar translation to the key while the key travels downward as the key is depressed by the user RR. A computing system comprising a keyboard as recited in paragraph QQ.

SS. A human-machine interaction (HMI) apparatus comprising:
- a touchsurface presented to a user to facilitate, at least in part, human to computer interaction therethrough by the user depressing the touchsurface;
- a translational mechanism operatively associated with the touchsurface, the translational mechanism being configured to constrain the touchsurface to prevent rotation of the touchsurface but enable a translation in response to a downward force from the user depressing the touchsurface.

TT. An HMI apparatus as recited in paragraph SS, wherein the translational mechanism includes multiple supports positioned under and/or around the touchsurface so as to ameliorate and/or eliminate wobbling, shaking, and/or tilting of the touchsurface while the touchsurface travels downward as the user depresses the touchsurface.

UU. An HMI apparatus as recited in paragraph SS, wherein the translational mechanism includes multiple supports arrayed along a periphery of an underside of the touchsurface, along a perimeter of the touchsurface, and/or outside the periphery of the touchsurface.

VV. An HMI apparatus as recited in paragraph SS, wherein the translational mechanism is configured to impart a planar movement translation to the touchsurface while the touchsurface travels downward as the user depresses the touchsurface.

WW. An HMI apparatus as recited in paragraph SS, wherein the translational mechanism includes multiple ramps arrayed along a periphery of an underside of the touchsurface, along a perimeter of the touchsurface, and/or outside the periphery of the touchsurface.

XX. An HMI apparatus as recited in paragraph SS, wherein the translational mechanism includes a four-bar linkage mechanism, wherein a rigid sidebar is hinged to opposite edges of the touchsurface and also to a base thereunder the touchsurface.

YY. An HMI apparatus as recited in paragraph SS, wherein the translational mechanism includes a rib-and-groove mechanism, wherein one or more ribs of the touchsurface ride in one or more grooves of a structure defining a cavity within which a touchsurface descends when traveling vertically.

What is claimed is:

1. An input device comprising:
a rigid body including a touchsurface configured to travel along a depression path in response to being depressed by a user;
a leveling mechanism operatively associated with the touchsurface, the leveling mechanism configured to keep the touchsurface substantially level as the touchsurface travels along the depression path in response to being depressed by the user;
a planar-translation-effecting mechanism operatively associated with the touchsurface, the planar-translation-effecting mechanism configured to define a planar translation component of the depression path, such that the touchsurface exhibits planar translation as the touchsurface travels along the depression path; and
a capacitive keyswitch sensor configured to detect a variable capacitance affected by motion of the touchsurface along the depression path.

2. The input device of claim 1, wherein the rigid body comprises a rectangular body having greater width than depth, and greater breadth than depth.

3. The input device of claim 1, wherein the leveling mechanism is further configured to keep the touchsurface level as the touchsurface returns to an unpressed position in response to a release from being depressed by the user.

4. The input device of claim 1, further comprising:
conductive material physically coupled to the rigid body, such that motion of the rigid body moves the conductive material, wherein the capacitive keyswitch sensor comprises a capacitive sensor electrode configured to capacitively couple with the conductive material and define the variable capacitance.

5. The input device of claim 1, wherein the leveling mechanism and the planar-translation-effecting mechanism function simultaneously as the touchsurface travels along the depression path.

6. The input device of claim 5, wherein the same mechanism comprises a plurality of ramps disposed proximate to a perimeter region of the rigid body.

7. The input device of claim 6, wherein the plurality of ramps are configured such that the depression path is linear.

8. The input device of claim 1, further comprising:
a ready mechanism configured to keep the touchsurface in an unpressed position; and
a return mechanism configured to return the touchsurface to the unpressed position.

9. The input device of claim 1, further comprising a combined ready/return mechanism configured to keep the touchsurface in an unpressed position until depressed by the user and thereafter to return the touchsurface to the unpressed position.

10. The input device of claim 9, wherein the combined ready/return mechanism utilizes magnetic attraction.

11. The input device of claim 10, wherein the combined ready/return mechanism comprises at least one magnet and at least one piece of non-magnetic, ferrous material.

12. A keyboard comprising:
a plurality of keycaps, each keycap of the plurality of keycaps having a first face configured to be pressed by a user and a second face comprising a first guide feature;
a keyguide configured to guide keycap motion, the keyguide comprising a plurality of second guide features, wherein each second guide feature of the plurality of second guide features configured to operate with the first guide feature of an associated keycap to define an associated path traveled by the associated keycap in response to press input applied to the associated keycap by a user, and wherein each second guide feature is further configured to operate with the first guide feature of the associated keycap to keep the associated keycap substantially level as the associated keycap travels along the associated path; and
a non-elastomeric tactile feedback mechanism operatively associated with the keycap, the tactile feedback mechanism configured to provide a resisting force in response to the press.

13. The keyboard of claim 12, further comprising:
a capacitive keyswitch sensor configured to detect a variable capacitance affected by motion of the touchsurface along the depression path.

14. The keyboard of claim 12, wherein the first guide feature of a first keycap of the plurality of keycaps comprises a plurality of inclined surfaces, and wherein the second guide feature associated with the first keycap comprises a plurality of ramps configured to contact the plurality of inclined surfaces.

15. The keyboard of claim 12, wherein the non-elastomeric tactile feedback mechanism comprises at least one magnet and at least one piece of non-magnetic, ferrous material.

16. The keyboard of claim 12, wherein the associated path of a first key cap of the plurality of keycaps differs from the associated path of a second key cap of the plurality of keycaps.

17. The keyboard of claim 16, wherein the associated path of the first key cap of the plurality of keycaps and the associated path of the second key cap of the plurality of keycaps differs in an amount of lateral motion.

18. The keyboard of claim 12, wherein the non-elastomeric tactile feedback mechanism utilizes magnetism to provide the resisting force in response to the press.

19. The method of claim 18, wherein the resisting the press input comprises using magnetism, and wherein the effecting translation of the keycap along a path while keeping the keycap substantially level comprises guiding the keycap using a plurality of ramps.

20. A method of operating a key assembly comprising:
resisting a press input applied by a user to a keycap of the key assembly;
effecting translation of the keycap along a path while keeping the keycap substantially level in response to the press input, the translation having a planar translation component;

returning the keycap to an unpressed position in response to a release of the press;
sensing a variable capacitance defined by motion of the keycap along the path; and
determining an actuation state of the keyswitch in response to a value of the variable capacitance.

* * * * *